(12) United States Patent
Yue et al.

(10) Patent No.: US 12,114,535 B2
(45) Date of Patent: Oct. 8, 2024

(54) COUNTER SUBSTRATE, DISPLAY PANEL, AND DISPLAY APPARATUS

(71) Applicant: BOE Technology Group Co., Ltd., Beijing (CN)

(72) Inventors: Yang Yue, Beijing (CN); Shi Shu, Beijing (CN); Qi Yao, Beijing (CN); Wei Huang, Beijing (CN); Haitao Huang, Beijing (CN); Shipei Li, Beijing (CN); Yong Yu, Beijing (CN); Xiang Li, Beijing (CN); Chuanxiang Xu, Beijing (CN); Wenqu Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 590 days.

(21) Appl. No.: 17/428,630

(22) PCT Filed: Oct. 19, 2020

(86) PCT No.: PCT/CN2020/121795
§ 371 (c)(1),
(2) Date: Aug. 5, 2021

(87) PCT Pub. No.: WO2022/082341
PCT Pub. Date: Apr. 28, 2022

(65) Prior Publication Data
US 2022/0302229 A1    Sep. 22, 2022

(51) Int. Cl.
*H10K 59/122* (2023.01)
*G02B 5/20* (2006.01)

(52) U.S. Cl.
CPC ........... *H10K 59/122* (2023.02); *G02B 5/201* (2013.01)

(58) Field of Classification Search
CPC .............................. H10K 59/122; G02B 5/201
(Continued)

(56) References Cited

U.S. PATENT DOCUMENTS

| 2005/0112485 A1 | 5/2005 | Lee et al. |
| 2016/0285049 A1 | 9/2016 | Song et al. |

(Continued)

FOREIGN PATENT DOCUMENTS

| CN | 102148324 A | 8/2011 |
| CN | 103529592 A | 1/2014 |

(Continued)

OTHER PUBLICATIONS

International Search Report & Written Opinion mailed Jul. 15, 2021, regarding PCT/CN2020/121795.

*Primary Examiner* — Jami Valentine Miller
(74) *Attorney, Agent, or Firm* — Intellectual Valley Law, P.C.

(57) ABSTRACT

A counter substrate is provided. The counter substrate includes a bank layer on a base substrate and defining a plurality of bank apertures; a quantum dots material layer on the base substrate, the quantum dots material layer including a plurality of quantum dots blocks respectively in at least some of the plurality of bank apertures; and a support layer on a side of the quantum dots material layer and the bank layer away from the base substrate. The support layer includes one or more support portions, orthographic projections of which on the base substrate adjacent to a periphery of an orthographic projection of a respective one of the plurality of bank apertures on the base substrate. An orthographic projection of the bank layer on the base substrate at least partially overlaps with an orthographic projection of the support layer on the base substrate.

18 Claims, 20 Drawing Sheets

(58) Field of Classification Search
USPC .......................................................... 257/91
See application file for complete search history.

(56) References Cited

U.S. PATENT DOCUMENTS

| | | | |
|---|---|---|---|
| 2017/0227813 | A1 | 8/2017 | Park et al. |
| 2019/0081282 | A1 | 3/2019 | Li |
| 2019/0206946 | A1* | 7/2019 | Xu ........................ H10K 59/121 |
| 2019/0371866 | A1 | 12/2019 | Kim et al. |
| 2019/0386253 | A1* | 12/2019 | Li ........................... H10K 59/38 |
| 2020/0144333 | A1 | 5/2020 | Kim et al. |
| 2021/0343895 | A1 | 11/2021 | Pan |
| 2022/0255030 | A1* | 8/2022 | Yu ......................... H10K 50/858 |
| 2022/0317513 | A1* | 10/2022 | Huang ................... G03F 7/0007 |

FOREIGN PATENT DOCUMENTS

| | | |
|---|---|---|
| CN | 104078489 A | 10/2014 |
| CN | 106547141 A | 3/2017 |
| CN | 107591430 A | 1/2018 |
| CN | 107731873 A | 2/2018 |
| CN | 107852795 A | 3/2018 |
| CN | 110544708 A | 12/2019 |
| CN | 110928021 A | 3/2020 |
| CN | 111146248 A | 5/2020 |
| EP | 1785766 A1 | 5/2007 |
| IN | 210119644 U | 2/2020 |

* cited by examiner

COUNTER SUBSTRATE, DISPLAY PANEL, AND DISPLAY APPARATUS

CROSS-REFERENCE TO RELATED APPLICATION

This application is a national stage application under 35 U.S.C. § 371 of International Application No. PCT/CN2020/121795, filed Oct. 19, 2020, the contents of which are incorporated by reference in the entirety.

TECHNICAL FIELD

The present invention relates to display technology, more particularly, to a counter substrate, a display panel, and a display apparatus.

BACKGROUND

Quantum dots have unique photoluminescence and electroluminescence properties due to quantum size effects and dielectric confinement effects. Quantum dots have excellent optical properties such as high quantum yield, high photochemical stability, anti-photolysis, broad-band excitation, narrow-band emission, high color purity, and a tunable color of emitted light through quantum dot size control. Various advantages such as high luminous efficiency, good stability, long service life, high brightness and broad color gamut can be obtained in a display panel utilizing quantum dots materials.

SUMMARY

In one aspect, the present disclosure provides a counter substrate, comprising a base substrate; a bank layer on the base substrate, the bank layer defining a plurality of bank apertures; a quantum dots material layer on the base substrate, the quantum dots material layer comprising a plurality of quantum dots blocks respectively in at least some of the plurality of bank apertures; and a support layer on a side of the quantum dots material layer and the bank layer away from the base substrate; wherein the support layer comprises one or more support portions, orthographic projections of which on the base substrate adjacent to a periphery of an orthographic projection of a respective one of the plurality of bank apertures on the base substrate; the bank layer and the support layer are in an inter-subpixel region of the counter substrate; and an orthographic projection of the bank layer on the base substrate at least partially overlaps with an orthographic projection of the support layer on the base substrate.

Optionally, the support layer is a lens layer comprising one or more lens portions, orthographic projections of which on the base substrate adjacent to a periphery of an orthographic projection of a respective one of the plurality of bank apertures on the base substrate; the bank layer and the lens layer are in the inter-subpixel region of the counter substrate; and an orthographic projection of the bank layer on the base substrate at least partially overlaps with an orthographic projection of the lens layer on the base substrate.

Optionally, the orthographic projection of the bank layer on the base substrate covers the orthographic projection of the lens layer on the base substrate.

Optionally, the lens layer is a unitary net structure with a plurality of openings; and a respective one of the plurality of openings is surrounded by lens portions of the lens layer.

Optionally, the counter substrate further comprises a low refractive index material in a space between adjacent lens portions of the lens layer; wherein a refractive index of the low refractive index material is less than a refractive index of the one or more lens portions.

Optionally, a width of the respective one of the one or more lens portions on a side closer to the bank layer along a direction from a first adjacent bank aperture to a second adjacent bank aperture is substantially same as a width of the bank layer on a side closer to the respective one of the one or more lens portions along the direction from the first adjacent bank aperture to the second adjacent bank aperture.

Optionally, the lens layer is disposed substantially throughout the inter-subpixel region.

Optionally, the lens layer is limited in a portion of the inter-subpixel region between adjacent subpixels of different colors, and is absent in a portion of the inter-subpixel region between adjacent subpixels of same color.

Optionally, the counter substrate further comprises a reflective coating layer on a side of the lens layer away from the base substrate; wherein the reflective coating layer is in the inter-subpixel region of the counter substrate; the orthographic projection of the bank layer on the base substrate covers an orthographic projection of the reflective coating layer on the base substrate; and the reflective coating layer comprises one or more reflective portions respectively coated on surfaces of the one or more lens portions.

Optionally, the reflective coating layer is a unitary net structure with a plurality of openings; and a respective one of the plurality of openings is surrounded by reflective portions of the reflective coating layer.

Optionally, the counter substrate further comprises an overcoat layer on a side of the quantum dots material layer and the bank layer away from the base substrate; wherein the lens layer is on a side of the overcoat layer away from the base substrate.

Optionally, the counter substrate further comprises a black matrix in the inter-subpixel region of the counter substrate; and the orthographic projection of the bank layer on the base substrate covers an orthographic projection of the black matrix on the base substrate.

Optionally, the counter substrate further comprises a color filter layer on the base substrate; wherein the color filter layer comprises a plurality of color filter blocks respectively in the plurality of bank apertures.

In another aspect, the present disclosure provides a display panel, comprising an array substrate; and a counter substrate facing the array substrate; wherein the counter substrate comprises a base substrate; a bank layer on the base substrate, the bank layer defining a plurality of bank apertures; a quantum dots material layer on the base substrate, the quantum dots material layer comprising a plurality of quantum dots blocks respectively in at least some of the plurality of bank apertures; and a support layer on a side of the quantum dots material layer and the bank layer away from the base substrate; wherein the support layer comprises one or more support portions, orthographic projections of which on the base substrate adjacent to a periphery of an orthographic projection of a respective one of the plurality of bank apertures on the base substrate; the bank layer and the support layer are in an inter-subpixel region of the display panel; and an orthographic projection of the bank layer on the base substrate at least partially overlaps with an orthographic projection of the support layer on the base substrate.

Optionally, the support layer is a lens layer comprising one or more lens portions, orthographic projections of which on the base substrate adjacent to a periphery of an orthographic projection of a respective one of the plurality of bank apertures on the base substrate; the bank layer and the lens layer are in the inter-subpixel region of the counter substrate; and an orthographic projection of the bank layer on the base substrate at least partially overlaps with an orthographic projection of the lens layer on the base substrate.

Optionally, the one or more lens portions of the lens layer are in direct contact with a second inorganic encapsulating sub-layer of an encapsulating layer in the array substrate.

Optionally, the lens layer is a unitary net structure with a plurality of openings; and a respective one of the plurality of openings is surrounded by lens portions of the lens layer.

Optionally, the display panel further comprises a low refractive index material in a space between adjacent lens portions of the lens layer; wherein a refractive index of the low refractive index material is less than a refractive index of the one or more lens portions.

Optionally, a refractive index of the low refractive index material is less than a refractive index of the second inorganic encapsulating sub-layer.

Optionally, a width of the respective one of the one or more lens portions on a side closer to the bank layer along a direction from a first adjacent bank aperture to a second adjacent bank aperture is substantially same as a width of the bank layer on a side closer to the respective one of the one or more lens portions along the direction from the first adjacent bank aperture to the second adjacent bank aperture.

Optionally, the array substrate comprises a second base substrate; a plurality of thin film transistors on the second base substrate; a planarization layer on a side of the plurality of thin film transistors away from the second base substrate; an anode layer comprising a plurality of anodes on a side of the planarization layer away from the second base substrate; a pixel definition layer on a side of the planarization layer and the anode layer away from the second base substrate, the pixel definition layer defining a plurality of subpixel apertures; a light emitting material layer on a side of the anode layer away from the second base substrate, the light emitting material layer comprising a plurality of light emitting blocks respectively in the plurality of subpixel apertures; a cathode layer on a side of the light emitting material layer away from the second base substrate; and an encapsulating layer on a side of the cathode layer away from the second base substrate; wherein the one or more lens portions of the lens layer are in direct contact with the encapsulating layer; the pixel definition layer is in the inter-subpixel region of the display panel; and an orthographic projection of the bank layer on the base substrate at least partially overlaps with an orthographic projection of the pixel definition layer on the base substrate.

Optionally, the orthographic projection of the bank layer on the base substrate covers the orthographic projection of the lens layer on the base substrate; and the orthographic projection of the pixel definition layer on the base substrate covers the orthographic projection of the lens layer on the base substrate.

Optionally, the counter substrate further comprises a reflective coating layer on a side of the lens layer away from the base substrate; wherein the reflective coating layer is in the inter-subpixel region of the counter substrate; orthographic projections of the bank layer and the pixel definition layer on the base substrate covers an orthographic projection of the reflective coating layer on the base substrate; and the reflective coating layer comprises one or more reflective portions respectively coated on surfaces of the one or more lens portions.

Optionally, the reflective coating layer is a unitary net structure with a plurality of openings; and a respective one of the plurality of openings is surrounded by reflective portions of the reflective coating layer.

Optionally, the counter substrate further comprises an overcoat layer on a side of the quantum dots material layer and the bank layer away from the base substrate; and wherein the lens layer is on a side of the overcoat layer away from the base substrate.

Optionally, a cell gap between the overcoat layer of the counter substrate and the array substrate is in a range of 1 μm to 6 μm.

Optionally, a focal length of a lens portion of the lens layer is expressed as $1/f=1/U+1/V$; wherein f stands for the focal length of the lens portion; U stands for a first light path distance along a first light path of an edge light at a maximum view angle of an adjacent light emitting block with respect to the lens portion travelling from the adjacent light emitting block to the lens portion; V stands for a second light path distance along a second light path of the edge light from the lens portion to the bank layer; $U=H/\sin(\alpha)$; $V=(h1+h)/\sin(\beta)$; $\alpha$ is a first angle between the first light path and a plane containing a surface of the array substrate in direct contact with the lens portion; $\beta$ is a second angle between the plane containing the surface of the array substrate in direct contact with the lens portion and the second light path; H is a shortest distance between a surface of the adjacent light emitting block and the plane containing the surface of the array substrate in direct contact with the lens portion; and (h1+h) is a shortest distance between the plane containing the surface of the array substrate in direct contact with the lens portion and the bank layer.

Optionally, a width of the lens portion along a direction from a first adjacent bank aperture to a second adjacent bank aperture is expressed as $L=(2(h1+h)/\tan(\beta))+Z$; wherein Z stands for an assembling tolerance in assembling the counter substrate and the array substrate.

Optionally, a curvature radius of the lens portion is expressed as $r=2f^*(n-1)$; wherein r stands for the curvature radius; and n stands for a refractive index of the lens portion.

In another aspect, the present disclosure provides a display apparatus, comprising the display panel described herein or fabricated by a method described herein, and an integrated circuit connected to the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a counter substrate, a display panel, and a display apparatus that substantially obviate one or more of the problems due to limitations and disadvantages of the related art. In one aspect, the present disclosure provides a counter substrate. In some embodiments, the counter substrate includes a base substrate; a bank layer on the base substrate, the bank layer defining a plurality of bank apertures; a quantum dots material layer on the base substrate, the quantum dots material layer comprising a plurality of quantum dots blocks respectively in at least some of the plurality of bank apertures; and a lens layer on a side of the quantum dots material layer and the bank layer away from the base substrate. Optionally, the lens layer includes one or more lens portions substantially surrounding a respective one of the plurality of bank apertures. Optionally, the bank layer and the lens layer are in an inter-subpixel region of the counter substrate. Optionally, an orthographic projection of the bank layer on the base substrate at least partially overlaps with an orthographic projection of the lens layer on the base substrate.

Figure 1A:
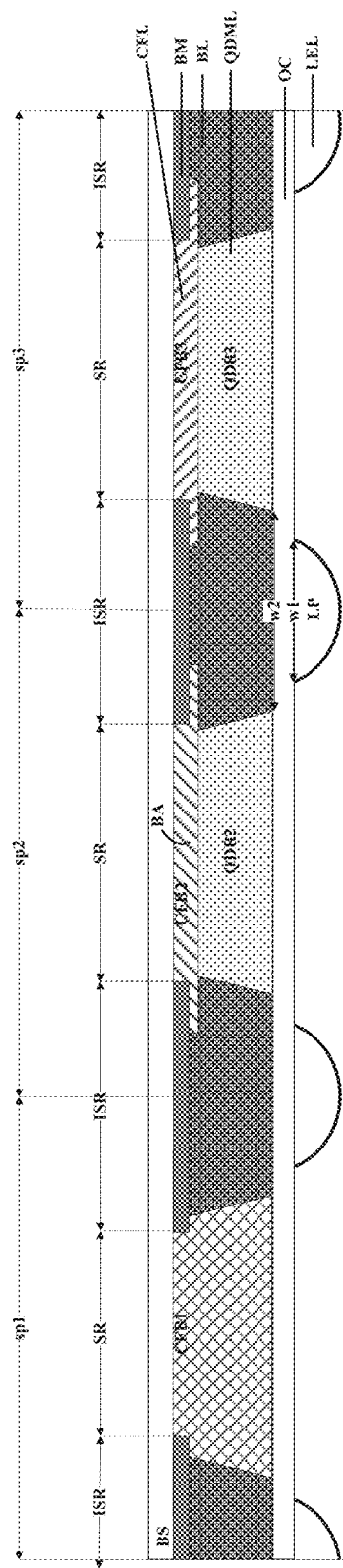
FIG. 1A is a schematic diagram illustrating the structure of a counter substrate in some embodiments according to the present disclosure.
Figure 1B:
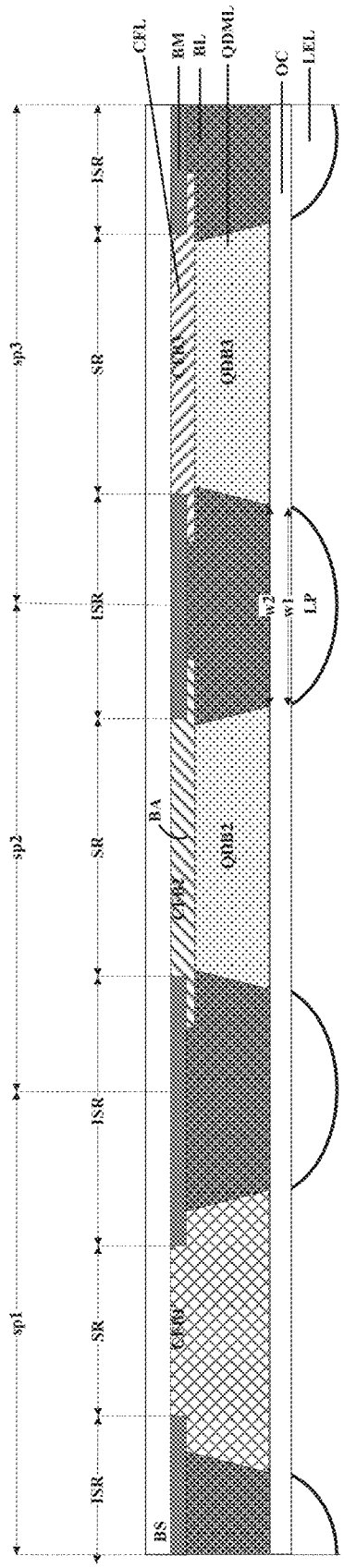
FIG. 1B is a schematic diagram illustrating the structure of a counter substrate in some embodiments according to the present disclosure.
Figure 2:
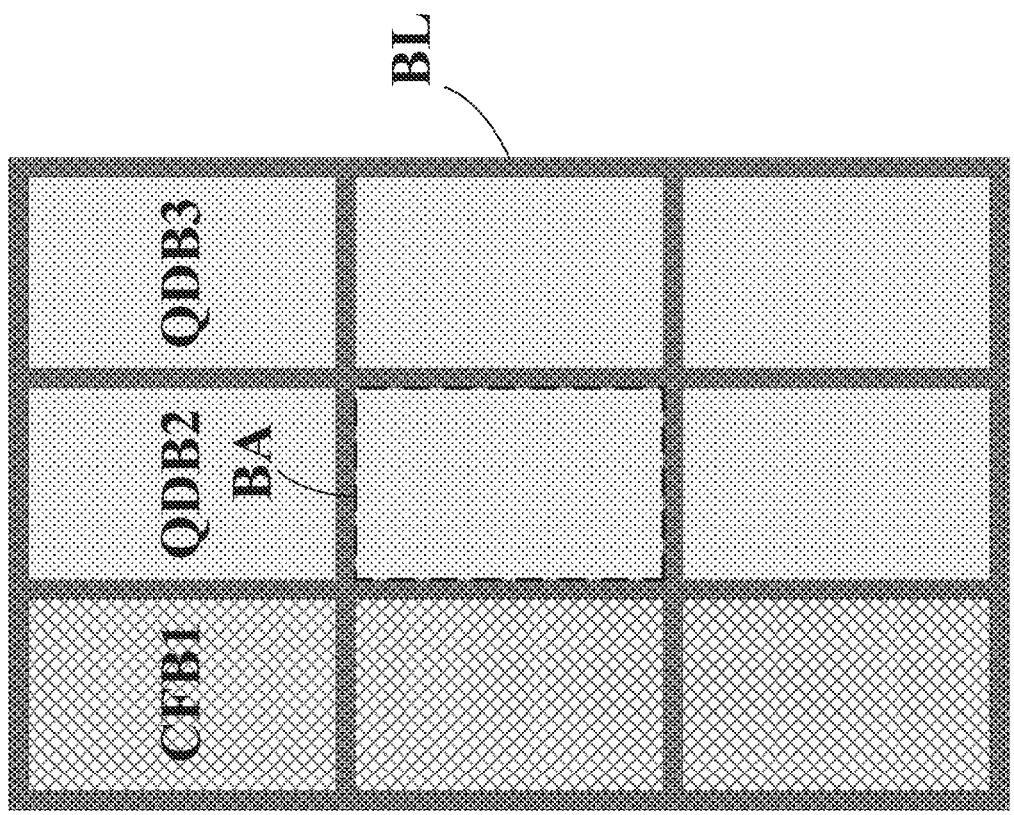
FIG. 2 is a plan view of a bank layer and a quantum dots layer in a counter substrate in some embodiments according to the present disclosure.

FIG. 1A is a schematic diagram illustrating the structure of a counter substrate in some embodiments according to the present disclosure. FIG. 1B is a schematic diagram illustrating the structure of a counter substrate in some embodiments according to the present disclosure. FIG. 2 is a plan view of a bank layer and a quantum dots layer in a counter substrate in some embodiments according to the present disclosure. FIG. 4 is a scanning electron microscopy cross-sectional view image of a lens portion of a lens layer in some embodiments according to the present disclosure. Referring to FIG. 1A, FIG. 1B, FIG. 2 to FIG. 4, the counter substrate in some embodiments includes a base substrate BS; a bank layer BL on the base substrate, the bank layer BL defining a plurality of bank apertures BA; a quantum dots material layer QDML on the base substrate BS, the quantum dots material layer QDML including a plurality of quantum dots blocks (e.g., QDB2 and QDB3) respectively in at least some of the plurality of bank apertures BA; and a support layer on a side of the quantum dots material layer QDML and the bank layer BL away from the base substrate BS. In some embodiments, the support layer is a lens layer LEL as shown in FIG. 1A, FIG. 1B, FIG. 2 to FIG. 4.

Referring to FIG. 1A and FIG. 1B, regions in the counter substrate respectively corresponding to a plurality of subpixels are denoted. In some embodiments, the display panel includes a plurality of subpixels. In one example, the display panel includes a plurality of subpixels of first color sp1 (e.g., blue subpixels), a plurality of subpixels of second color sp2 (e.g., red subpixels), and a plurality of subpixels of third color sp3 (e.g., green subpixels). Optionally, the bank layer BL is in an inter-subpixel region ISR of the counter substrate.

In some embodiments, the quantum dots material layer QDML includes a plurality of quantum dots blocks respectively in at least some of the plurality of bank apertures BA. In one example, the quantum dots material layer QDML includes a plurality of quantum dots blocks of a second color QDB2 respectively in bank apertures respectively in the plurality of subpixels of second color sp2, and a plurality of quantum dots blocks of a third color QDB3 respectively in bank apertures respectively in the plurality of subpixels of third color sp3.

Optionally, the quantum dots material layer QDML is absent in the bank apertures respectively in the plurality of subpixels of first color sp1. In one example, in the bank apertures respectively in the plurality of subpixels of first color sp1, the counter substrate includes color filter blocks of the first color CFB1, as shown in FIG. 1A, FIG. 1B, and FIG. 2. In another example, in the bank apertures respectively in the plurality of subpixels of first color sp1, the counter substrate includes a plurality of transparent blocks.

Optionally, the quantum dots material layer QDML further includes a plurality of quantum dots blocks of a first color respectively in bank apertures respectively in the plurality of subpixels of first color sp1.

In some embodiments, the counter substrate further includes a color filter layer CFL on a side of the quantum dots material layer QDML closer to the base substrate BS, or away from an overcoat layer OC. In some embodiments, the color filter layer CFL includes a plurality of color filter blocks respectively on a side of the plurality of bank apertures BA closer to the base substrate BS, or away from the overcoat layer OC. In one example, the color filter layer CFL includes a plurality of color filter blocks of a first color CFB1 (e.g., blue color filter blocks) in the plurality of subpixels of the first color (e.g., blue subpixels), a plurality of color filter blocks of a second color CFB2 (e.g., red color filter blocks) in the plurality of subpixels of the second color (e.g., red subpixels), and a plurality of color filter blocks of a third color CFB3 (e.g., green color filter blocks) in the plurality of subpixels of the third color (e.g., green subpixels).

As used herein, an inter-subpixel region refers to a region between adjacent subpixel regions, such as a region corresponding to a black matrix in a liquid crystal display, a region corresponding a pixel definition layer in an organic light emitting diode display panel, or a bank layer in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission blocks in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

Figure 3A:
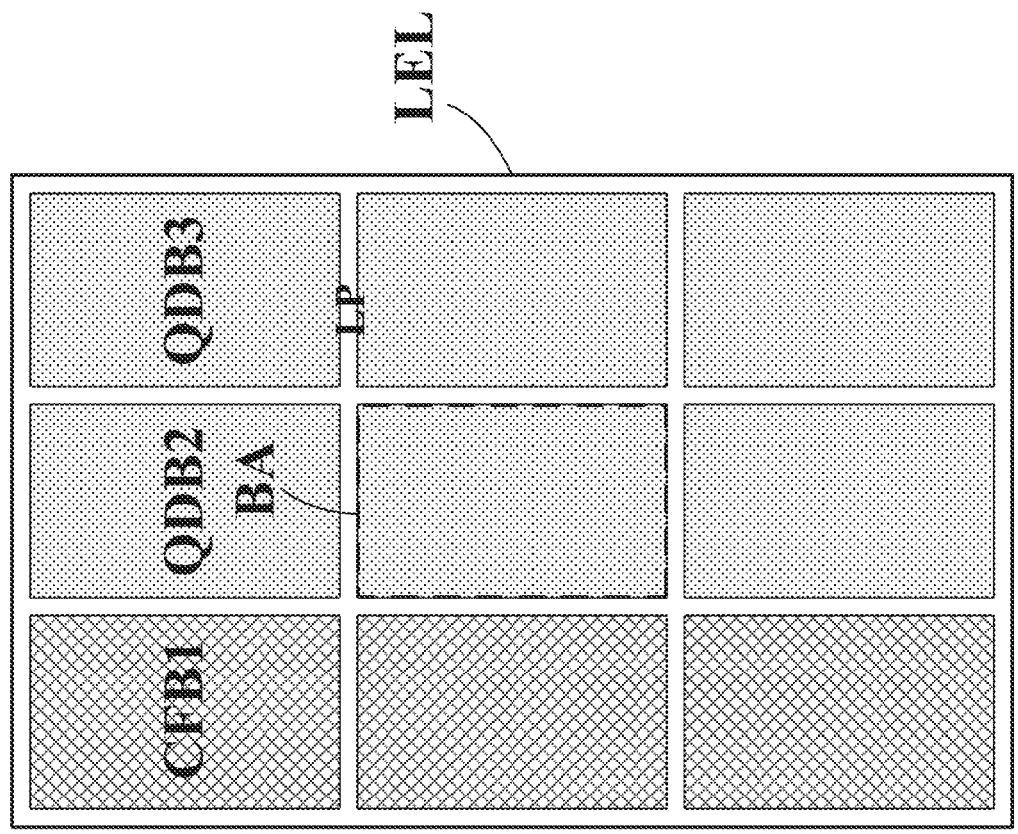
FIG. 3A is a plan view of a lens layer and a quantum dots layer in a counter substrate in some embodiments according to the present disclosure.
Figure 4:
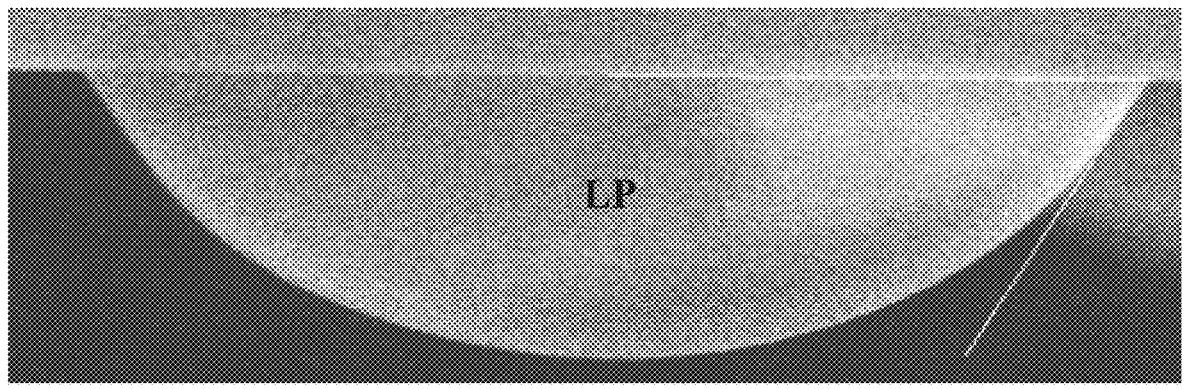
FIG. 4 is a scanning electron microscopy cross-sectional view image of a lens portion of a lens layer in some embodiments according to the present disclosure.

FIG. 3A is a plan view of a lens layer and a quantum dots layer in a counter substrate in some embodiments according to the present disclosure. Referring to FIG. 3A, in some embodiments, the lens layer LEL is disposed substantially throughout the inter-subpixel region. In one example, the lens layer LEL covers an entirety of one side of the bank layer closer to the lens layer LEL.

Figure 3C:
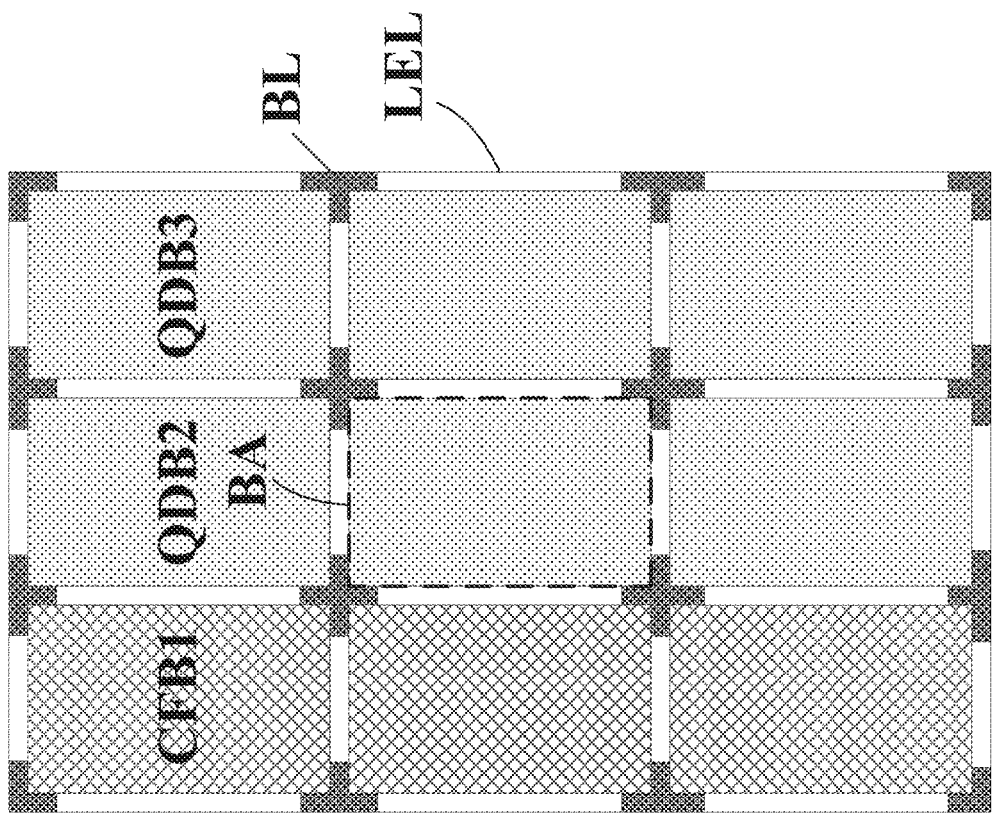
FIG. 3C is a plan view of a lens layer and a quantum dots layer in a counter substrate in some embodiments according to the present disclosure.
Figure 3B:
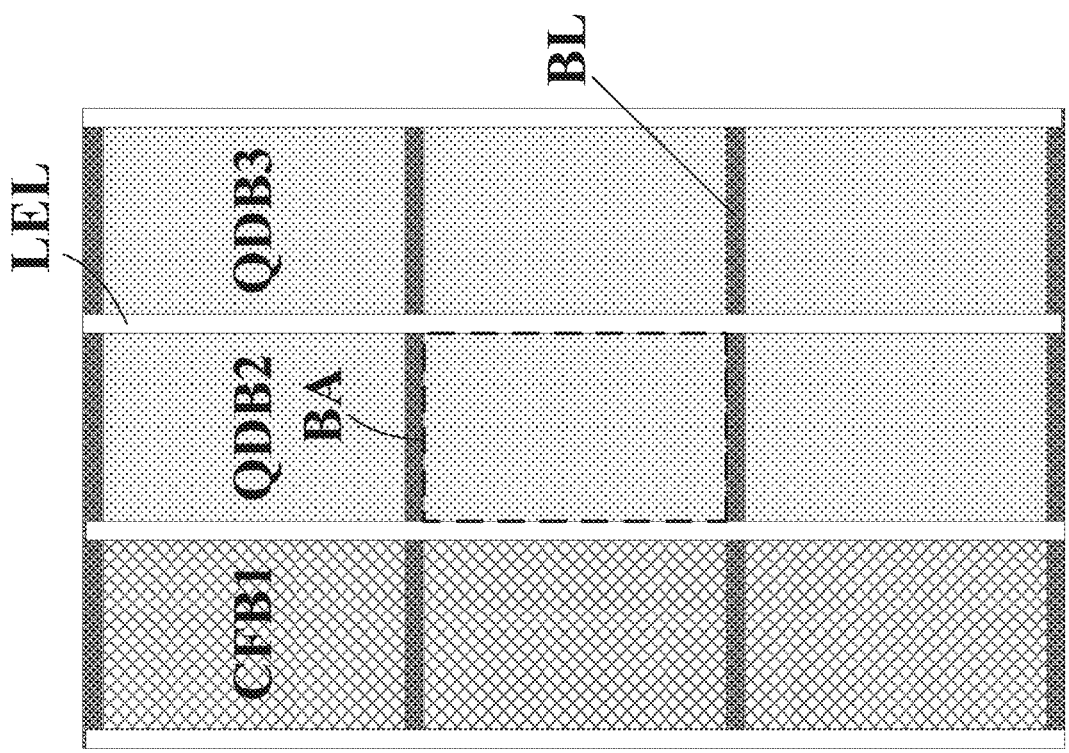
FIG. 3B is a plan view of a lens layer and a quantum dots layer in a counter substrate in some embodiments according to the present disclosure.

FIG. 3B is a plan view of a lens layer and a quantum dots layer in a counter substrate in some embodiments according to the present disclosure. Referring to FIG. 3B, in some embodiments, the lens layer LEL is limited in a portion of the inter-subpixel region. In one example, the lens layer LEL is present in a portion of the inter-subpixel region between adjacent subpixels of different colors, and is absent in a portion of the inter-subpixel region between adjacent subpixels of same color.

FIG. 3C is a plan view of a lens layer and a quantum dots layer in a counter substrate in some embodiments according to the present disclosure. Referring to FIG. 3B, in some embodiments, the lens layer LEL is present in portions of the inter-subpixel region. In one example, the lens layer LEL is absent in an intersection sub-region of the inter-subpixel region where a row of inter-subpixel sub-region and a column of inter-subpixel sub-region intersect with each other.

Figure 5:
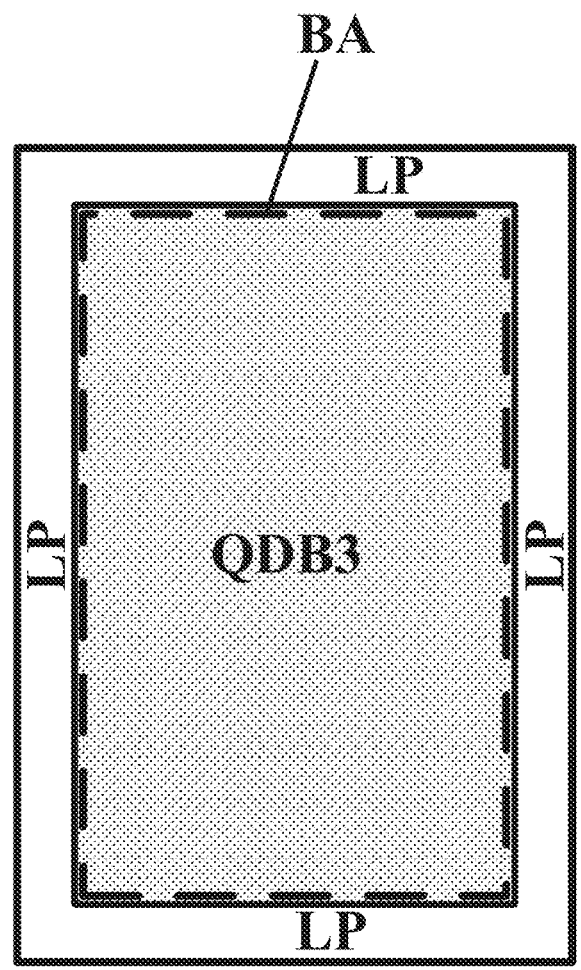
FIG. 5 is a zoom-in plan view of a respective one of the plurality of bank apertures in a counter substrate in some embodiments according to the present disclosure.

FIG. 5 is a zoom-in plan view of a respective one of the plurality of bank apertures in a counter substrate in some embodiments according to the present disclosure. Referring to FIG. 1A, FIG. 1B, FIG. 2, and FIG. 5, the lens layer LEL in some embodiments includes one or more lens portions LP, orthographic projections of which on the base substrate adjacent to a periphery of an orthographic projection of a respective one of the plurality of bank apertures BA on the base substrate. In some embodiments, the bank layer and the lens layer LEL are in an inter-subpixel region ISR of the counter substrate. Optionally, at least one of the bank layer and the lens layer LEL is limited in the inter-subpixel region ISR of the counter substrate.

Optionally, an orthographic projection of the bank layer BL on the base substrate BS at least partially overlaps with an orthographic projection of the lens layer LEL on the base substrate BS. Optionally, the orthographic projection of the bank layer BL on the base substrate BS covers the orthographic projection of the lens layer LEL on the base substrate BS. Optionally, the orthographic projection of the lens layer LEL on the base substrate BS is substantially non-overlapping with an orthographic projection of the quantum dots material layer QDML on the base substrate BS. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping.

The one or more lens portions LP may have various appropriate shapes. Referring to FIG. 1A, FIG. 1B, and FIG. 4, in some embodiments, a respective lens portion has a partial cylinder shape.

Referring to FIG. 1A, a maximum width of a respective one of the one or more lens portions LP along a direction from a first adjacent bank aperture to a second adjacent bank aperture is less than a minimum width of the bank layer BL along the direction from the first adjacent bank aperture to the second adjacent bank aperture. In one example, a width w1 of the respective one of the one or more lens portions LP on a side closer to the bank layer BL along the direction from the first adjacent bank aperture to the second adjacent bank aperture is smaller than a width w2 of the bank layer BL on a side closer to the respective one of the one or more lens portions LP along the direction from the first adjacent bank aperture to the second adjacent bank aperture.

Referring to FIG. 1B, a maximum width of the respective one of the one or more lens portions LP along the direction from the first adjacent bank aperture to the second adjacent bank aperture is substantially same as a minimum width of the bank layer BL along the direction from the first adjacent bank aperture to the second adjacent bank aperture. In one example, a width w1 of the respective one of the one or more lens portions LP on a side closer to the bank layer BL along the direction from the first adjacent bank aperture to the second adjacent bank aperture is substantially same as a width w2 of the bank layer BL on a side closer to the respective one of the one or more lens portions LP along the direction from the first adjacent bank aperture to the second adjacent bank aperture. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, the counter substrate further includes a low refractive index material in a space between adjacent lens portions of the lens layer LEL. Optionally, the low refractive index material is air or vacuum. Optionally, a refractive index of the low refractive index material is less than a refractive index of the one or more lens portions LP.

Figure 6A:
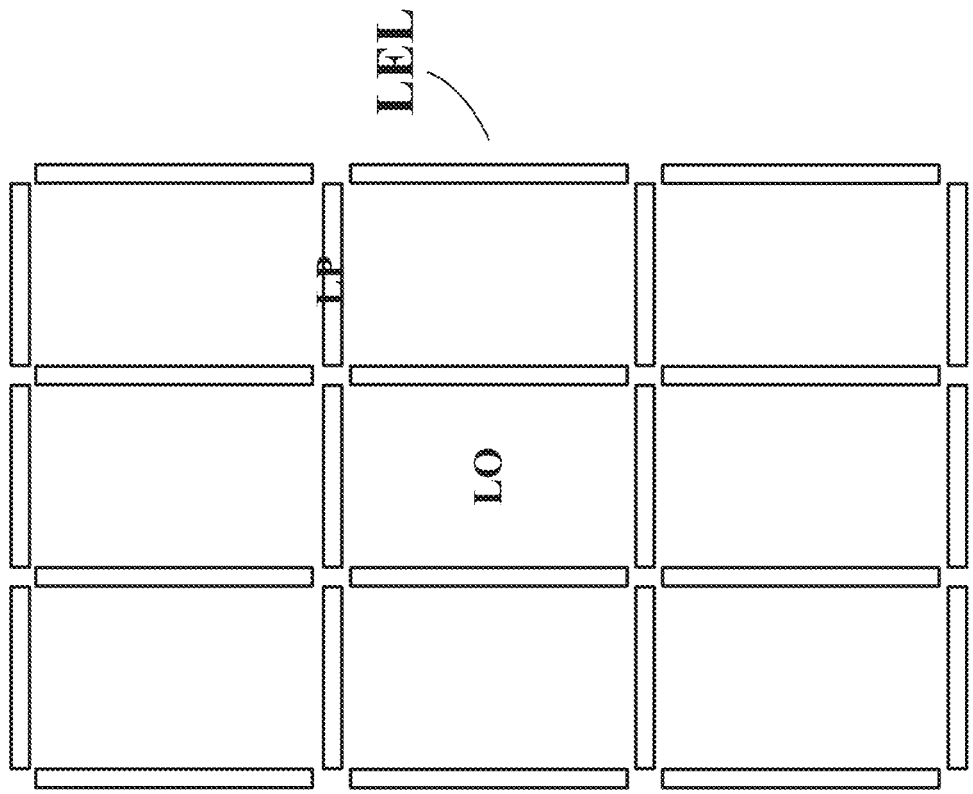
FIG. 6A is a schematic diagram illustrating the structure of a lens layer in some embodiments according to the present disclosure.
Figure 6B:
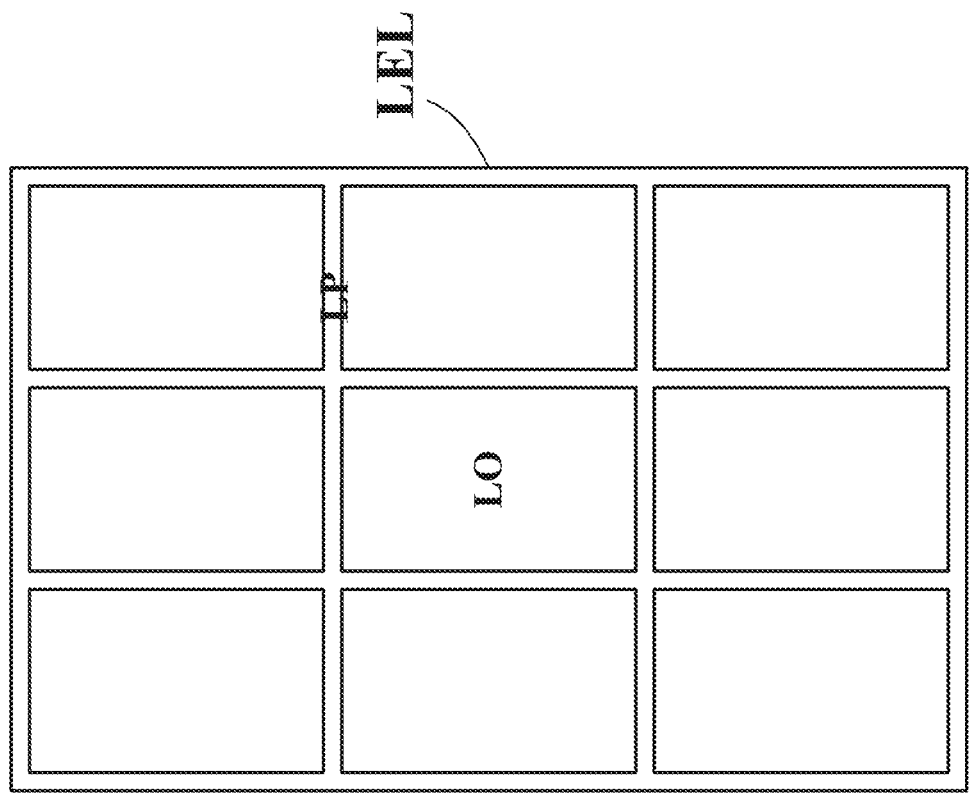
FIG. 6B is a schematic diagram illustrating the structure of a lens layer in some embodiments according to the present disclosure.

FIG. 6A is a schematic diagram illustrating the structure of a lens layer in some embodiments according to the present disclosure. FIG. 6B is a schematic diagram illustrating the structure of a lens layer in some embodiments according to the present disclosure. Referring to FIG. 6A and FIG. 6B, the lens layer LEL in some embodiments has a net structure with a plurality of openings LO. A respective one of the plurality of openings LO is surrounded by lens portions LP of the lens layer LEL. Referring to FIG. 6A, the net structure of the lens layer LEL in some embodiments is a unitary net structure. Referring to FIG. 6B, the net structure of the lens layer LEL in some embodiments includes a plurality of separate lens portions.

Figure 7A:
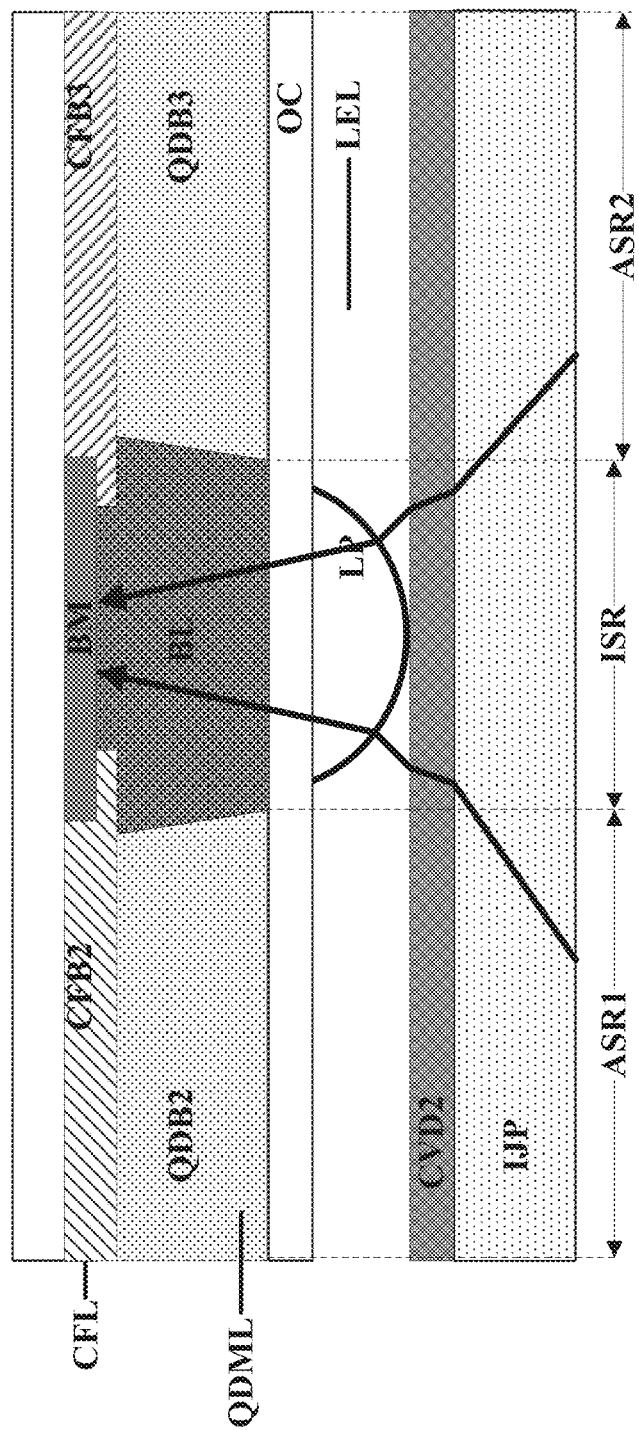
FIG. 7A illustrates a working principle of a lens portion in a counter substrate in some embodiments according to the present disclosure.

FIG. 7A illustrates a working principle of a lens portion in a counter substrate in some embodiments according to the present disclosure. Referring to FIG. 7A, light emitted from a first adjacent subpixel region ASR1 encounters a lens portion LP of the lens layer LEL, the incident light is converged at an interface between the lens portion LP and a medium outside of the lens portion LP. The refracted light continues travelling through the lens portion LP until it arrives at the bank layer BL, where the light is either absorbed (e.g., when the bank layer BL is made of a black material or light absorbing material) or reflected back (e.g., when the bank layer BL is made of a reflective material). Similarly, light emitted from a second adjacent subpixel region ASR2 encounters the lens portion LP of the lens layer LEL, the incident light is converged at an interface between the lens portion LP and a medium outside of the lens portion LP. The refracted light continues travelling through the lens portion LP until it arrives at the bank layer BL, where the light is either absorbed (e.g., when the bank layer BL is made of a black material or light absorbing material) or reflected back (e.g., when the bank layer BL is made of a reflective material). The inventors of the present disclosure discover that, by having a lens layer throughout the inter-subpixel region ISR, cross-contamination of light between adjacent subpixel regions can be surprisingly yet effectively prevented. In one example, a medium between adjacent lens portions (e.g., an air medium) has a refractive index less than a refractive index of the lens portion LP, and less than a refractive index of a layer underneath the lens portion LP (e.g., a second encapsulating inorganic sub-layer CVD2 as shown in FIG. 7A).

Figure 7B:
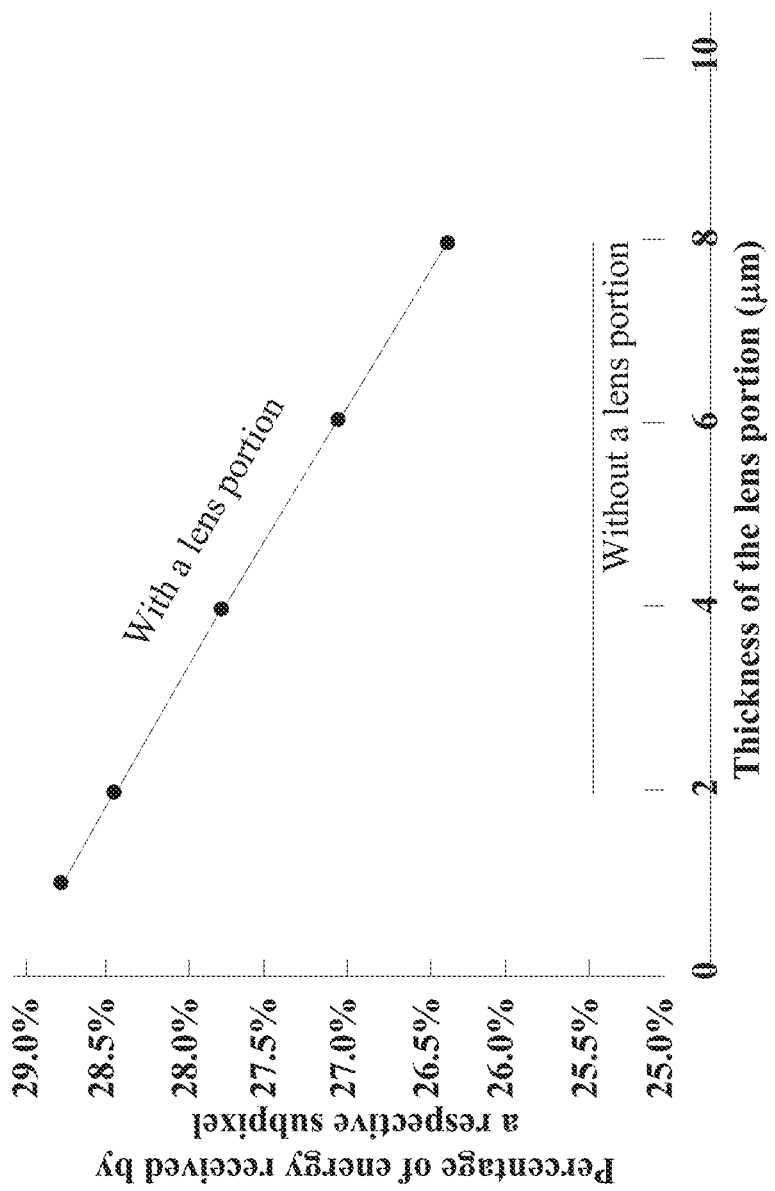
FIG. 7B illustrates a relationship between a thickness of a lens portion and a percentage of energy received by a respective subpixel in some embodiments according to the present disclosure.

FIG. 7B illustrates a relationship between a thickness of a lens portion and a percentage of energy received by a respective subpixel in some embodiments according to the present disclosure. Referring to FIG. 7B, having a lens portion LP significantly enhance energy utilization of the display panel as demonstrated by an increase in the percentage of energy received by a respective subpixel, as compared to that without a lens portion. Moreover, the inventors of the present disclosure discover that a thickness of the lens portion LP along a direction from the lens portion LP to the bank layer BL affects the energy utilization. The higher the thickness, the lower the percentage of energy received by a respective subpixel. The measurements shown in FIG. 7B are taken using a lens portion LP have a width along a direction from a first adjacent bank aperture to a second adjacent bank aperture of 20 µm.

Figure 8:
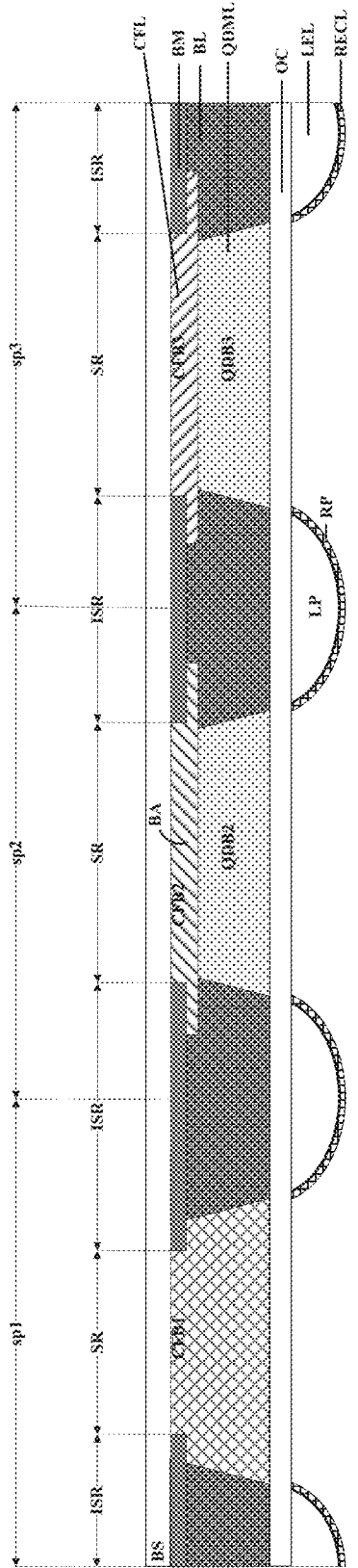
FIG. 8 is a schematic diagram illustrating the structure of a counter substrate in some embodiments according to the present disclosure.
Figure 9:
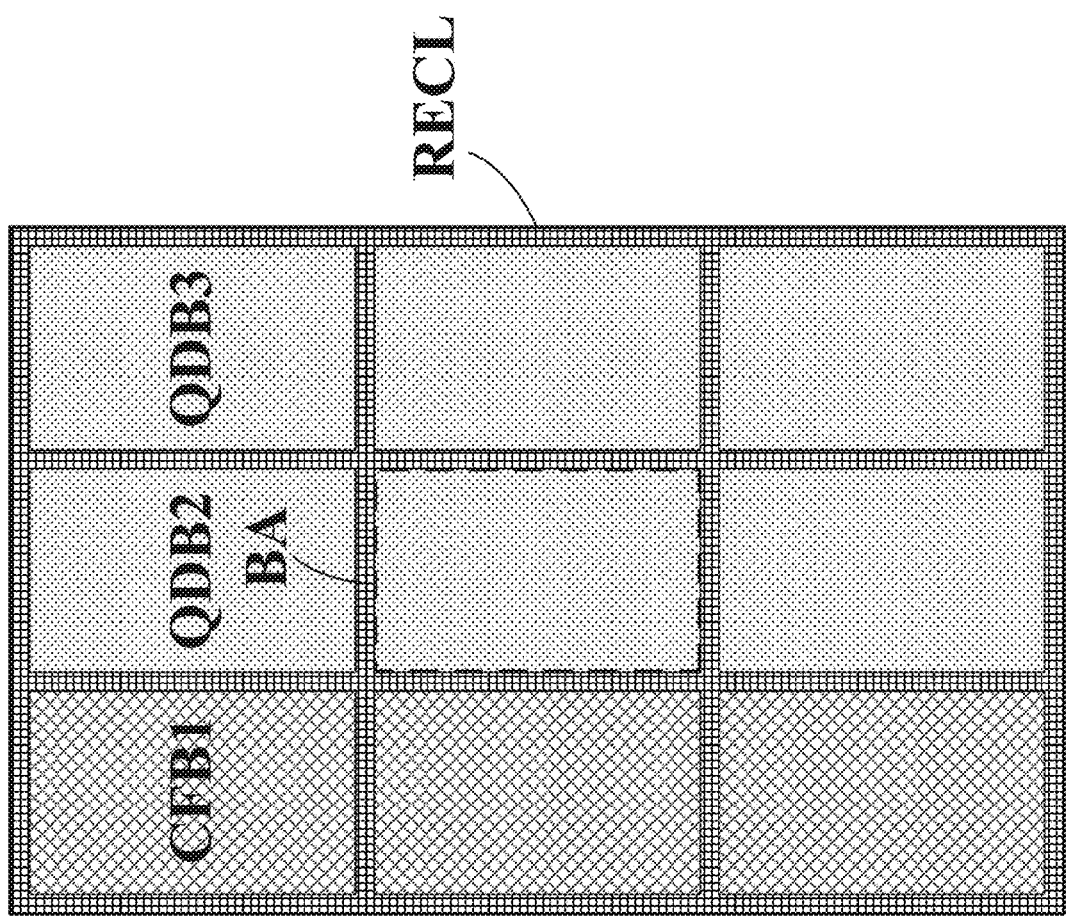
FIG. 9 is a plan view of a reflective coating layer and a quantum dots layer in a counter substrate in some embodiments according to the present disclosure.

FIG. 8 is a schematic diagram illustrating the structure of a counter substrate in some embodiments according to the present disclosure. FIG. 9 is a plan view of a reflective coating layer and a quantum dots layer in a counter substrate in some embodiments according to the present disclosure. Referring to FIG. 8 and FIG. 9, the counter substrate in some embodiments further includes a reflective coating layer RECL on a side of the support layer away from the base substrate BS. In some embodiments, the support layer is a lens layer LEL as shown in FIG. 8, and the reflective coating layer RECL is on a side of the lens layer LEL away from the base substrate BS.

Figure 10:
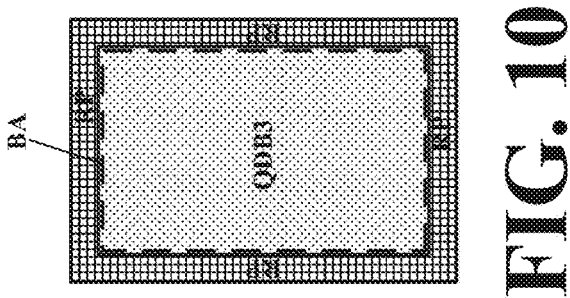
FIG. 10 is a zoom-in plan view of a respective one of the plurality of bank apertures in a counter substrate in some embodiments according to the present disclosure.

FIG. 10 is a zoom-in plan view of a respective one of the plurality of bank apertures in a counter substrate in some embodiments according to the present disclosure. Referring to FIG. 8, FIG. 9, and FIG. 10, the reflective coating layer RECL in some embodiments includes one or more reflective portions RP, orthographic projections of which on the base substrate adjacent to a periphery of an orthographic projection of a respective one of the plurality of bank apertures BA on the base substrate. In some embodiments, the bank layer BL, the lens layer LEL, and the reflective coating layer RECL are in an inter-subpixel region ISR of the counter substrate. Optionally, at least one of the bank layer BL, the lens layer LEL, or the reflective coating layer RECL, is limited in the inter-subpixel region ISR of the counter substrate.

Optionally, an orthographic projection of the bank layer BL on the base substrate BS at least partially overlaps with an orthographic projection of the reflective coating layer RECL on the base substrate BS. Optionally, the orthographic projection of the bank layer BL on the base substrate BS covers the orthographic projection of the reflective coating layer RECL on the base substrate BS. Optionally, the orthographic projection of the reflective coating layer RECL on the base substrate BS is substantially non-overlapping with an orthographic projection of the quantum dots material layer QDML on the base substrate BS.

Optionally, an orthographic projection of the lens layer LEL on the base substrate BS at least partially overlaps with an orthographic projection of the reflective coating layer RECL on the base substrate BS. Optionally, the orthographic projection of the lens layer LEL on the base substrate BS and the orthographic projection of the reflective coating layer RECL on the base substrate BS substantially overlap with each other. As used herein, the term "substantially overlap" refers to two orthographic projections at least 50 percent, e.g., at least 60 percent, at least 70 percent, at least 80 percent, at least 90 percent, at least 95 percent, at least 99 percent, or 100 percent overlapping with each other.

Referring to FIG. 8, the one or more reflective portions RP of the reflective coating layer RECL in some embodiments are respectively coated on surfaces of the one or more lens portions LP. Accordingly, a respective reflective portion and a respective lens portion in some embodiments have a substantially same external contour. Optionally, the respective reflective portion has an internal contour substantially complementary to the external contour of the respective lens portion.

The one or more reflective portions RP may have various appropriate shapes. Referring to FIG. 8, in some embodiments, a respective reflective portion has a partial hollow cylinder shape. Optionally, a respective lens portion has a partial cylinder shape. Optionally, a combination of a respective lens portion and a respective reflective portion coated on the respective lens portion has a partial cylinder shape.

Figure 11B:
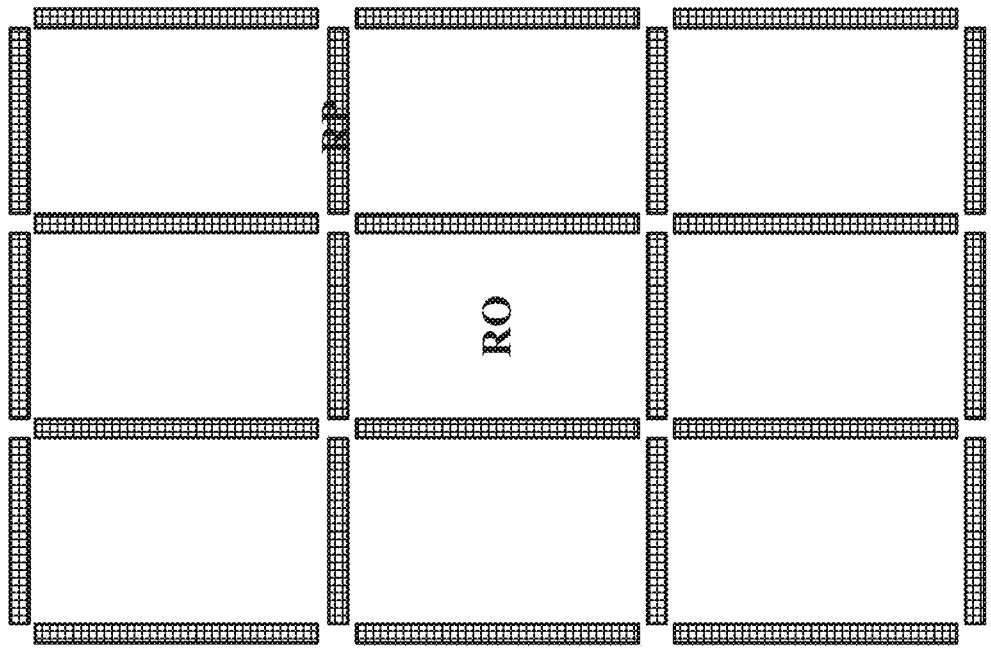
FIG. 11B is a schematic diagram illustrating the structure of a reflective coating layer in some embodiments according to the present disclosure.
Figure 11A:
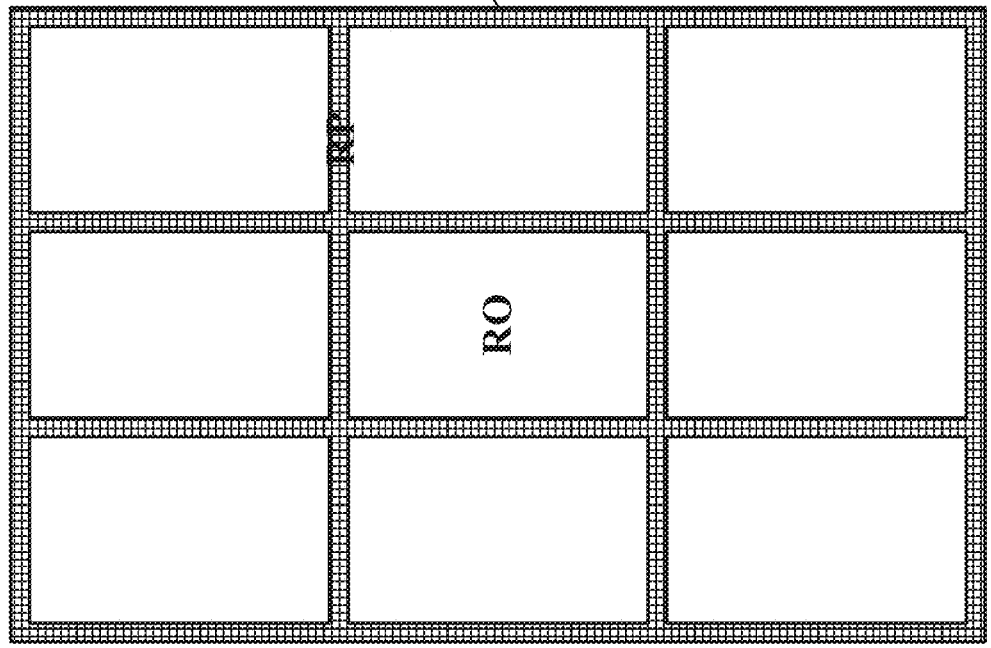
FIG. 11A is a schematic diagram illustrating the structure of a reflective coating layer in some embodiments according to the present disclosure.

FIG. 11A is a schematic diagram illustrating the structure of a reflective coating layer in some embodiments according to the present disclosure. FIG. 11B is a schematic diagram illustrating the structure of a reflective coating layer in some embodiments according to the present disclosure. Referring to FIG. 11A and FIG. 11B, the reflective coating layer RECL in some embodiments has a net structure with a plurality of openings RO. A respective one of the plurality of openings RO is surrounded by reflective portions RP of the reflective coating layer RECL. Referring to FIG. 11A, the net structure of the reflective coating layer RECL in some embodiments is a unitary net structure. Referring to FIG. 11B, the net structure of the reflective coating layer RECL in some embodiments includes a plurality of separate lens portions.

Figure 12:
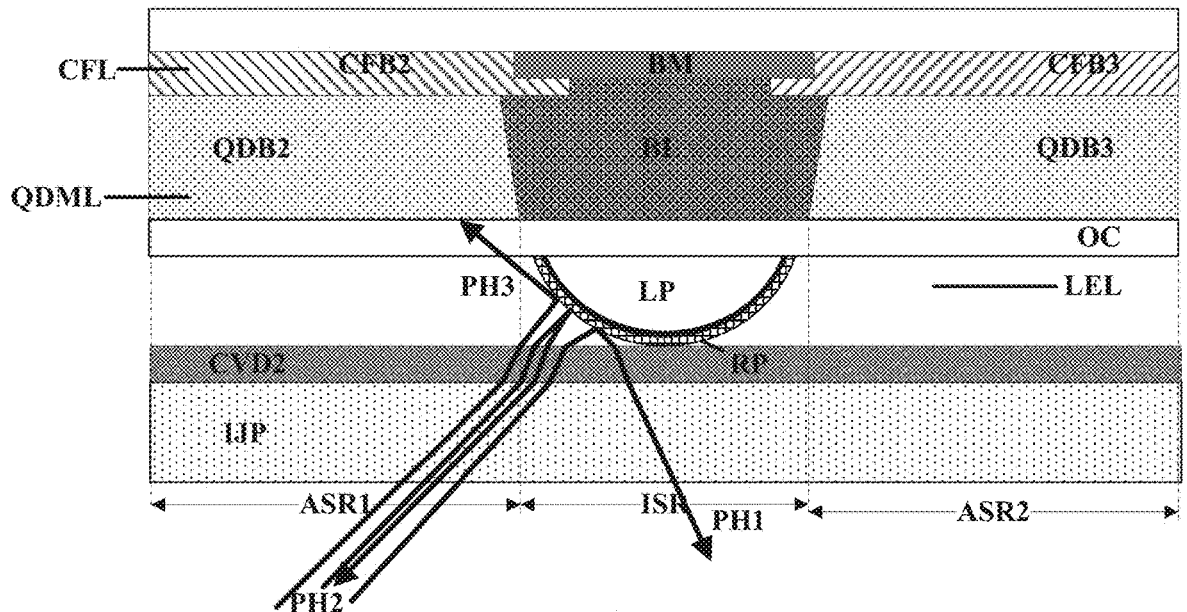
FIG. 12 illustrates a working principle of a reflective portion in a counter substrate in some embodiments according to the present disclosure.

FIG. 12 illustrates a working principle of a reflective portion in a counter substrate in some embodiments according to the present disclosure. Referring to FIG. 12, three exemplary light paths PH1, PH2, and PH3 are shown in FIG. 12. In one example, a medium between adjacent lens portions (e.g., an air medium) has a refractive index less than a refractive index of the lens portion LP, and less than a refractive index of a layer underneath the lens portion LP (e.g., a second encapsulating inorganic sub-layer CVD2 as shown in FIG. 12).

Along the light path PH1, light emitted from a first adjacent subpixel region ASR1 encounters a reflective portion RP of the reflective coating layer RECL, the incident light is reflected on a surface of the reflective portion RP. The reflected light travels towards layers underneath the lens portion LP (e.g., towards an inter-subpixel region of an array substrate, and more specifically, towards a pixel definition layer in the inter-subpixel region of the array substrate).

Along the light path PH2, light emitted from a first adjacent subpixel region ASR1 encounters a reflective portion RP of the reflective coating layer RECL, the incident light is reflected on a surface of the reflective portion RP. The reflected light travels towards the first adjacent subpixel region ASR1.

Along the light path PH3, light emitted from a first adjacent subpixel region ASR1 encounters a reflective portion RP of the reflective coating layer RECL, the incident light is reflected on a surface of the reflective portion RP. The reflected light continues traveling toward a respective one of the plurality of quantum dots blocks (e.g., QDB3) in the first adjacent subpixel region ASR1 (keeping the reflective light in a same subpixel region as the incident light). Similarly, light emitted from a second adjacent subpixel region ASR2 can encounter the reflective portion RP of the reflective coating layer RECL, the incident light is reflected on the surface of the reflective portion RP. The reflected light continues traveling toward a respective one of the plurality of quantum dots blocks (e.g., QDB2) in the second adjacent subpixel region ASR1 (keeping the reflective light in a same subpixel region as the incident light). The inventors of the present disclosure discover that, by having a reflective coating layer RECL throughout the inter-subpixel region ISR, cross-contamination of light between adjacent subpixel regions can be surprisingly yet effectively prevented.

Optionally, a respective lens portion is fully coated by a respective reflective portion, as shown in FIG. 12.

Figure 13:
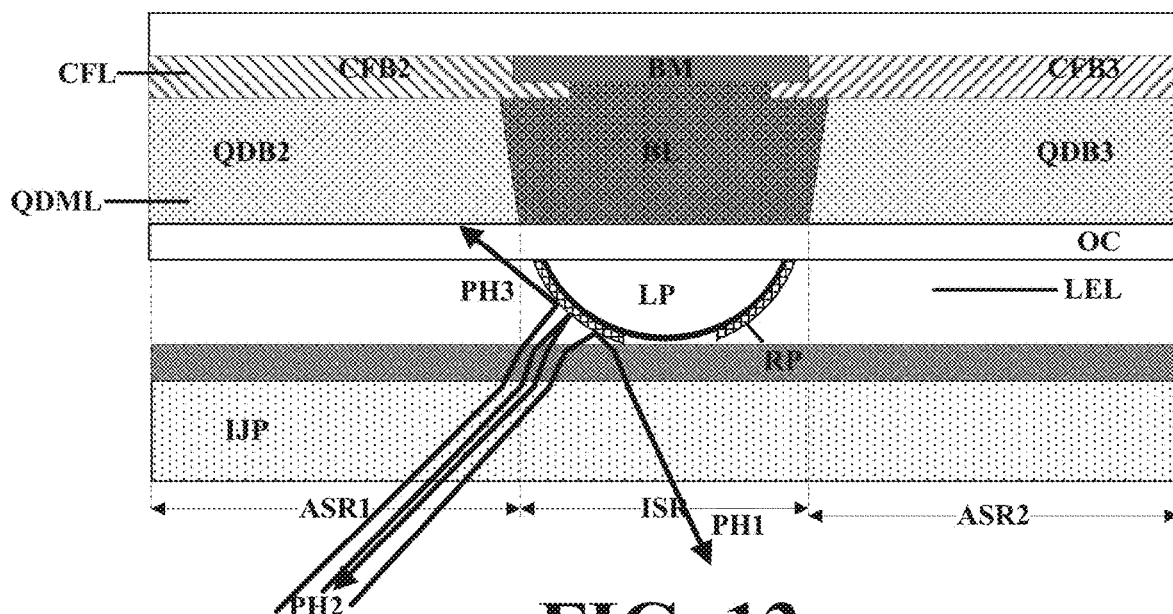
FIG. 13 illustrates a working principle of a reflective portion in a counter substrate in some embodiments according to the present disclosure.

FIG. 13 illustrates a working principle of a reflective portion in a counter substrate in some embodiments according to the present disclosure. Optionally, a respective lens portion is partially coated by a respective reflective portion, and partially exposed, as shown in FIG. 13.

In some embodiments, referring to FIG. 1A, FIG. 1B, and FIG. 8, the counter substrate further includes an overcoat layer OC on a side of the quantum dots material layer QDML and the bank layer BL away from the base substrate BS. Optionally, the overcoat layer OC is in direct contact with the quantum dots material layer QDML and in direct contact with the bank layer BL.

The lens layer LEL is on a side of the overcoat layer OC away from the base substrate BS. Optionally, the overcoat layer OC is in direct contact with the lens layer LEL. The overcoat layer OC provides a planarized surface for forming the lens portions LP of the lens layer LEL.

Referring to FIG. 8, optionally, the reflective coating layer RECL and the lens layer LEL are on a side of the overcoat layer OC away from the base substrate BS. Optionally, the overcoat layer OC is in direct contact with the lens layer LEL. Optionally, the overcoat layer OC is in direct contact with the reflective coating layer RECL. The overcoat layer OC provides a planarized surface for forming the lens portions LP of the lens layer LEL and the reflective portions RP of the reflective coating layer RECL.

Figure 14:
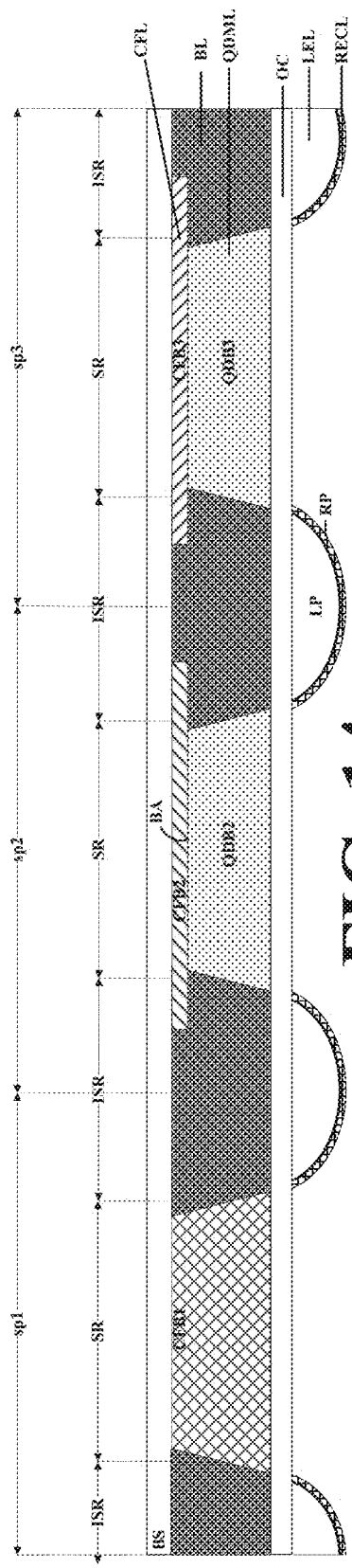
FIG. 14 is a schematic diagram illustrating the structure of a counter substrate in some embodiments according to the present disclosure.

FIG. 14 is a schematic diagram illustrating the structure of a counter substrate in some embodiments according to the present disclosure. Referring to FIG. 14, the counter substrate is absent of a separate, independent, black matrix. In one example, the bank layer BL functions as a black matrix. In another example, the reflective coating layer RECL functions as a black matrix. In another example, the lens layer LEL functions as a black matrix. In another example, a combination of at least two of the bank layer BL, the reflective coating layer RECL, or the lens layer LEL, functions as a black matrix.

Referring to FIG. 1A, FIG. 1B, and FIG. 8, in some embodiments, the counter substrate further includes a black matrix BM in the inter-subpixel region ISR of the counter substrate. Optionally, the bank layer BL is on a side of the black matrix BM away from the base substrate BS, e.g., the black matrix BM is between the base substrate BS and the bank layer BL.

Optionally, the orthographic projection of the bank layer BL on the base substrate BS and an orthographic projection of the black matrix BM on the base substrate BS at least partially overlap with each other. Optionally, the orthographic projection of the bank layer BL on the base substrate BS covers the orthographic projection of the black matrix BM on the base substrate BS.

In another aspect, the present disclosure provides a display panel. In some embodiments, the display panel includes an array substrate; and a counter substrate facing the array substrate. In some embodiments, the counter substrate includes a base substrate; a bank layer on the base substrate, the bank layer defining a plurality of bank apertures; a quantum dots material layer on the base substrate, the quantum dots material layer comprising a plurality of quantum dots blocks respectively in at least some of the plurality of bank apertures; and a lens layer on a side of the quantum dots material layer and the bank layer away from the base substrate. Optionally, the lens layer includes one or more lens portions, orthographic projections of which on the base substrate adjacent to a periphery of an orthographic projection of a respective one of the plurality of bank apertures on the base substrate; the bank layer and the lens layer are in an inter-subpixel region of the display panel; and an orthographic projection of the bank layer on the base substrate at least partially overlaps with an orthographic projection of the lens layer on the base substrate.

Figure 15:
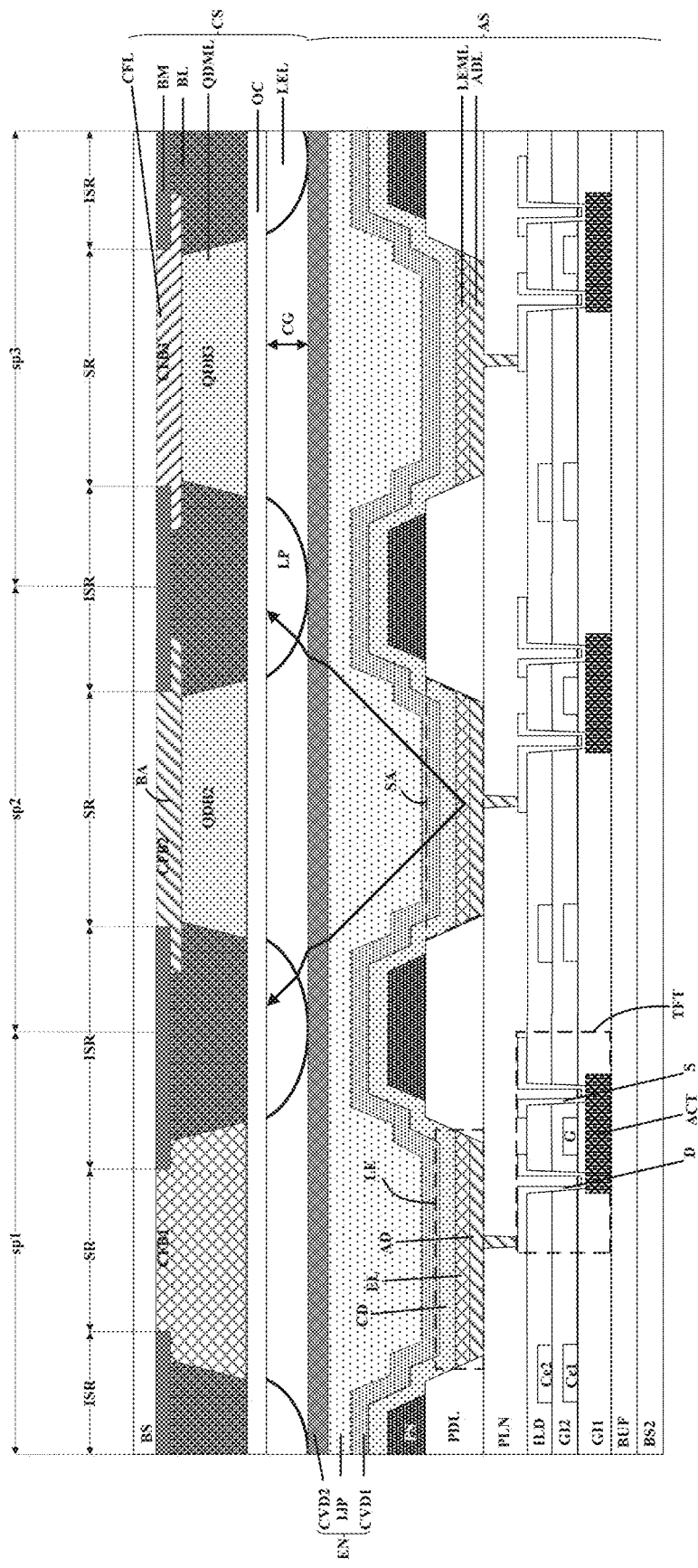
FIG. 15 is a schematic diagram illustrating the structure of a display panel in some embodiments according to the present disclosure.

FIG. 15 is a schematic diagram illustrating the structure of a display panel in some embodiments according to the present disclosure. Referring to FIG. 15, the display panel in some embodiments includes an array substrate AS and a counter substrate CS assembled together. In some embodiments, the array substrate AS includes a second base substrate BS2; a plurality of thin film transistors TFT on the second base substrate BS2; a planarization layer PLN on a side of the plurality of thin film transistors TFT away from the second base substrate BS2; an anode layer ADL including a plurality of anodes AD on a side of the planarization layer PLN away from the second base substrate BS2; a pixel definition layer PDL on a side of the planarization layer PLN and the anode layer ADL away from the second base substrate BS2, the pixel definition layer defining a plurality of subpixel apertures SA; a light emitting material layer LEML on a side of the anode layer ADL away from the second base substrate BS2, the light emitting material layer LEML including a plurality of light emitting blocks EL respectively in the plurality of subpixel apertures SA; a cathode layer CD on a side of the light emitting material layer away from the second base substrate BS2; and an encapsulating layer EN on a side of the cathode layer CD away from the second base substrate BS2. In some embodiments, the counter substrate CS includes a base substrate BS; a bank layer BL on the base substrate, the bank layer BL defining a plurality of bank apertures BA; a quantum dots material layer QDML on the base substrate BS, the quantum dots material layer QDML including a plurality of quantum dots blocks (e.g., QDB2 and QDB3) respectively in at least some of the plurality of bank apertures BA; and a lens layer LEL on a side of the quantum dots material layer QDML and the bank layer BL away from the base substrate BS.

Various appropriate light emitting material may be used in the present display panel. Examples of appropriate light emitting material include an organic light emitting material, a quantum dots light emitting material, a micro light emitting material, and an electroluminescence material. Accordingly, various appropriate light emitting elements may be used in the present display panel. Examples of appropriate light emitting elements include an organic light emitting diode, a quantum dots light emitting diode, a micro light emitting diode, and an electroluminescence diode.

In one example, and referring to FIG. 15, the array substrate AS includes a second base substrate BS2 (e.g., a flexible base substrate); a buffer layer BUF on the second base substrate BS2; an active layer ACT of a respective one of a plurality of thin film transistors TFT on a side of the buffer layer BUF away from the second base substrate BS2; a first gate insulating layer GI1 on a side of the active layer ACT away from the second base substrate BS2; a gate electrode G and a first capacitor electrode Ce1 on a side of the first gate insulating layer GI1 away from the insulating layer IN; a second gate insulating layer GI2 on a side of the gate electrode G and the first capacitor electrode Ce1 away from the first gate insulating layer GI1; a second capacitor electrode Ce2 on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D on a side of the inter-layer dielectric layer ILD away from the second gate insulating layer GI2; a planarization layer PLN on a side of the source electrode S and the drain electrode D away from the inter-layer dielectric layer ILD; a pixel definition layer PDL defining a subpixel aperture SA and on a side of the planarization layer PLN away from the second base substrate BS2; a spacer layer PS on a side of the pixel definition layer PDL away from the second base substrate BS2; and a light emitting element LE in the subpixel aperture SA. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the light emitting element LE, and on a side of the cathode layer CD away from the second base substrate BS2. The encapsulating layer EN in some embodiments includes a first inorganic encapsulating sub-layer CVD1 on a side of the cathode layer CD away from the second base substrate BS2, an organic encapsulating sub-layer IP on a side of the first inorganic encapsulating sub-layer CVD1 away from the second base substrate BS2, and a second inorganic encapsulating sub-layer CVD2 on a side of the organic encapsulating sub-layer IJP away from the first inorganic encapsulating sub-layer CVD1.

In some embodiments, the display panel includes a plurality of subpixels. In one example, and referring to FIG. 15, the display panel includes a plurality of subpixels of first color sp1 (e.g., blue subpixels), a plurality of subpixels of second color sp2 (e.g., red subpixels), and a plurality of subpixels of third color sp3 (e.g., green subpixels). In another example, the plurality of light emitting blocks EL in the plurality of subpixels of first color sp1, the plurality of subpixels of second color sp2, and a plurality of subpixels of third color sp3, are of a same color. For example, the plurality of light emitting blocks EL in the plurality of subpixels of first color sp1, the plurality of subpixels of second color sp2, and a plurality of subpixels of third color sp3, are all blue light emitting blocks.

Referring to FIG. 15, in some embodiments, the bank layer BL, the lens layer LEL, and the pixel definition layer PDL, are in an inter-subpixel region ISR of the display panel. Optionally, the spacer layer PS is also in the inter-subpixel region ISR of the display panel. Optionally, the plurality of light emitting blocks EL are in a subpixel region SR of the display panel. Optionally, at least one of the bank layer BL, the lens layer LEL, and the pixel definition layer PDL, is limited in the inter-subpixel region ISR of the counter substrate CS.

Optionally, an orthographic projection of the bank layer BL on the base substrate BS at least partially overlaps with an orthographic projection of the pixel definition layer PDL on the base substrate BS. Optionally, orthographic projections of the bank layer BL, the pixel definition layer PDL, the lens layer LEL, on the base substrate BS at least partially overlaps with each other. Optionally, the orthographic projection of the bank layer BL on the base substrate BS covers the orthographic projection of the lens layer LEL on the base substrate BS. Optionally, the orthographic projection of the pixel definition layer PDL on the base substrate BS covers the orthographic projection of the lens layer LEL on the base substrate BS. Optionally, the orthographic projection of the bank layer BL on the base substrate BS covers the orthographic projection of the lens layer LEL on the base substrate BS, and the orthographic projection of the pixel definition layer PDL on the base substrate BS covers the orthographic projection of the lens layer LEL on the base substrate BS.

Optionally, the orthographic projection of the lens layer LEL on the base substrate BS is substantially non-overlapping with an orthographic projection of the plurality of light emitting blocks EL on the base substrate BS. Optionally, the orthographic projection of the lens layer LEL on the base substrate BS is substantially non-overlapping with an orthographic projection of the anode layer ADL on the base substrate BS.

In some embodiments, the one or more lens portions LP of the lens layer LEL are in direct contact with the array substrate AS. Optionally, the one or more lens portions LP of the lens layer LEL are in direct contact with the encapsulating layer EN of the array substrate AS. Optionally, the one or more lens portions LP of the lens layer LEL are in direct contact with the second inorganic encapsulating sub-layer CVD2 of the encapsulating layer EN.

Optionally, between the overcoat layer OC of the counter substrate CS and the second inorganic encapsulating sub-layer CVD2 of the encapsulating layer EN of the array substrate AS, the display panel is absent of any structure component other than the lens layer LEL. Moreover, the display panel is absent of any structure component in a space between adjacent lens portions of the lens layer LEL, and between the overcoat layer OC of the counter substrate CS and the second inorganic encapsulating sub-layer CVD2 of the encapsulating layer EN of the array substrate AS.

In some embodiments, the counter substrate further includes a low refractive index material in a space between adjacent lens portions of the lens layer LEL. Optionally, the low refractive index material is air or vacuum. Optionally, a refractive index of the low refractive index material is less than a refractive index of the one or more lens portions LP. Optionally, a refractive index of the low refractive index material is less than a refractive index of the second inorganic encapsulating sub-layer CVD2 of the encapsulating layer EN. Optionally, a refractive index of the low refractive index material is less than a refractive index of any layer of the encapsulating layer EN.

Figure 16:
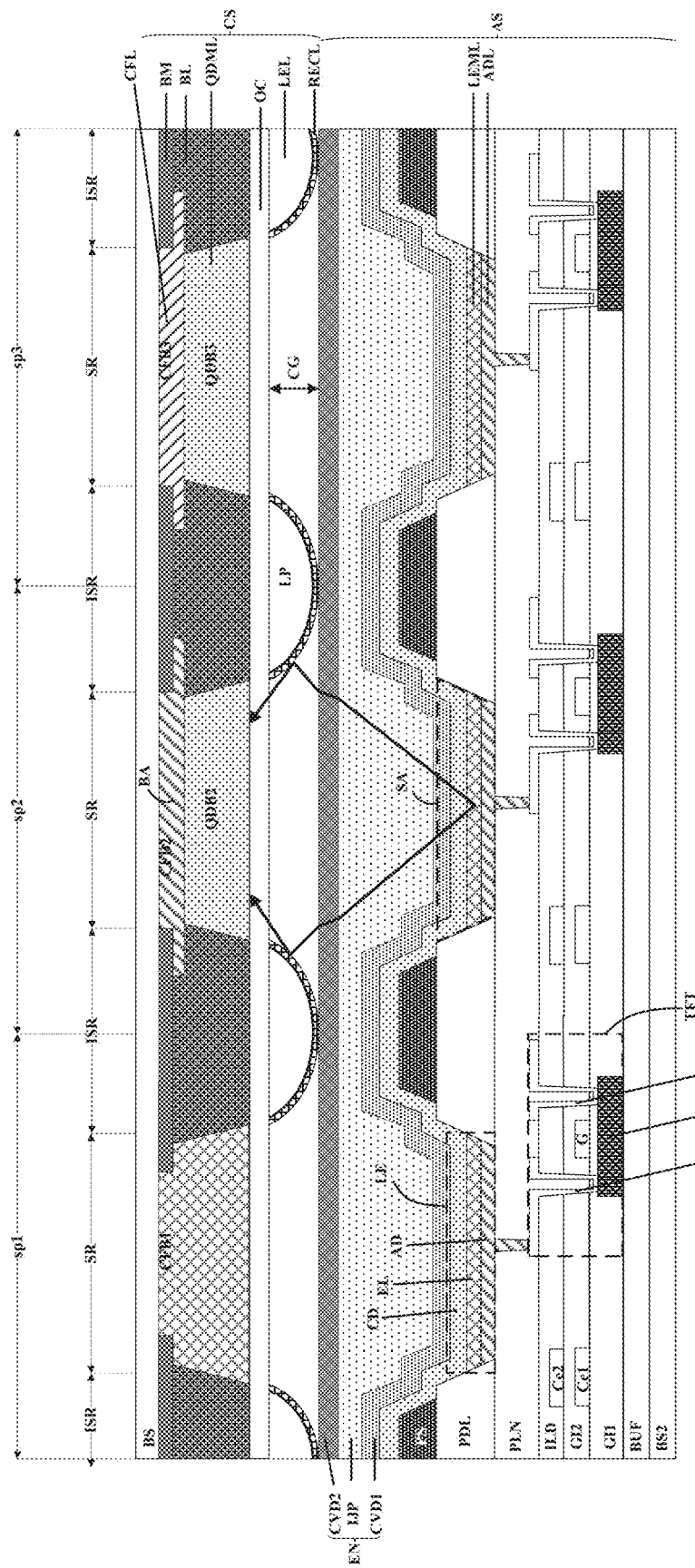
FIG. 16 is a schematic diagram illustrating the structure of a display panel in some embodiments according to the present disclosure.

FIG. 16 is a schematic diagram illustrating the structure of a display panel in some embodiments according to the present disclosure. Referring to FIG. 16, in some embodiments, the counter substrate CS in some embodiments further includes a reflective coating layer RECL on a side of the lens layer LEL away from the base substrate BS. In some embodiments, the bank layer BL, the lens layer LEL, and the reflective coating layer RECL are in an inter-subpixel region ISR of the counter substrate CS. Optionally, at least one of the bank layer BL, the lens layer LEL, or the reflective coating layer RECL, is limited in the inter-subpixel region ISR of the counter substrate CS.

Optionally, an orthographic projection of the bank layer BL on the base substrate BS at least partially overlaps with an orthographic projection of the reflective coating layer RECL on the base substrate BS. Optionally, the orthographic projection of the bank layer BL on the base substrate BS covers the orthographic projection of the reflective coating layer RECL on the base substrate BS.

Optionally, an orthographic projection of the lens layer LEL on the base substrate BS at least partially overlaps with an orthographic projection of the reflective coating layer RECL on the base substrate BS. Optionally, the orthographic projection of the lens layer LEL on the base substrate BS and the orthographic projection of the reflective coating layer RECL on the base substrate BS substantially overlap with each other.

Optionally, the orthographic projection of the reflective coating layer RECL on the base substrate BS is substantially non-overlapping with an orthographic projection of the plurality of light emitting blocks EL on the base substrate BS. Optionally, the orthographic projection of the reflective coating layer RECL on the base substrate BS is substantially non-overlapping with an orthographic projection of the anode layer ADL on the base substrate BS.

Referring to FIG. 16, the one or more reflective portions RP of the reflective coating layer RECL in some embodiments are respectively coated on surfaces of the one or more lens portions LP. Accordingly, a respective reflective portion and a respective lens portion in some embodiments have a substantially same external contour. Optionally, the respective reflective portion has an internal contour substantially complementary to the external contour of the respective lens portion.

The one or more reflective portions RP may have various appropriate shapes. Referring to FIG. 16, in some embodiments, a respective reflective portion has a partial hollow cylinder shape. Optionally, a respective lens portion has a partial cylinder shape. Optionally, a combination of a respective lens portion and a respective reflective portion coated on the respective lens portion has a partial cylinder shape.

In some embodiments, the one or more reflective portions RP of the reflective coating layer RECL are in direct contact with the array substrate AS. Optionally, the one or more reflective portions RP of the reflective coating layer RECL are in direct contact with the encapsulating layer EN of the array substrate AS. Optionally, the one or more reflective portions RP of the reflective coating layer RECL are in direct contact with the second inorganic encapsulating sub-layer CVD2 of the encapsulating layer EN.

Optionally, between the overcoat layer OC of the counter substrate CS and the second inorganic encapsulating sub-layer CVD2 of the encapsulating layer EN of the array substrate AS, the display panel is absent of any structure component other than the lens layer LEL and the reflective coating layer RECL. Moreover, the display panel is absent of any structure component in a space between adjacent lens portions and adjacent reflective portions, and between the overcoat layer OC of the counter substrate CS and the second inorganic encapsulating sub-layer CVD2 of the encapsulating layer EN of the array substrate AS.

Figure 17:
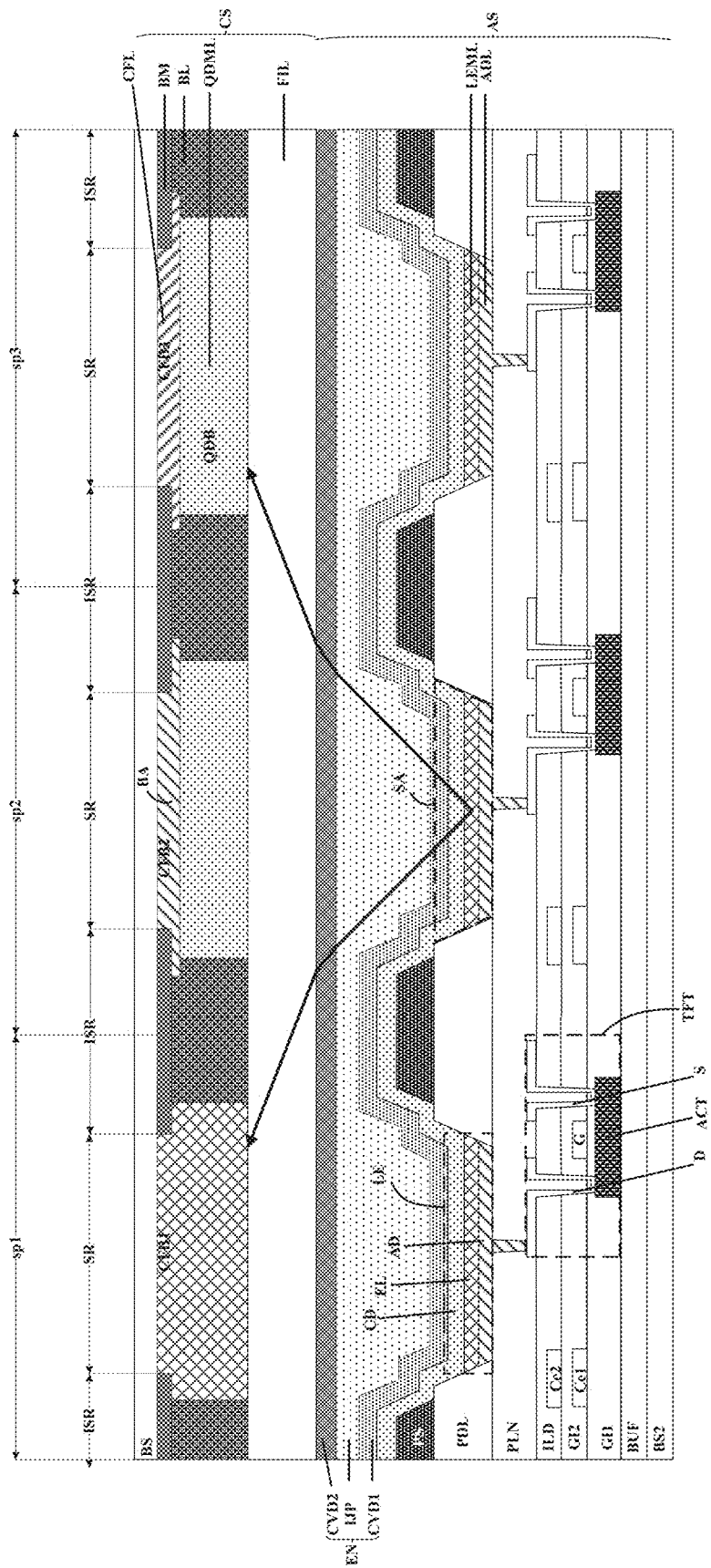
FIG. 17 is a schematic diagram illustrating the structure of a display panel in some embodiments according to the present disclosure.
Figure 18A:
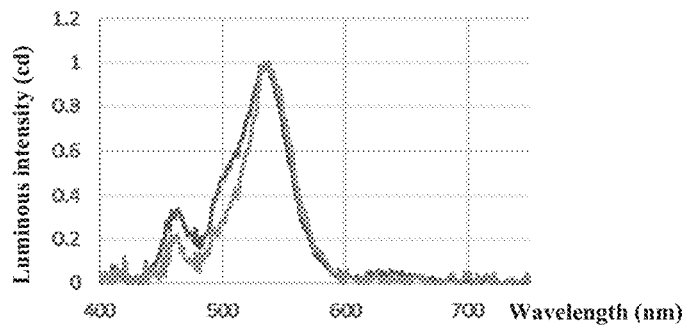
FIG. 18A shows light spectrum detected in a display panel depicted in FIG. 17.
Figure 18B:
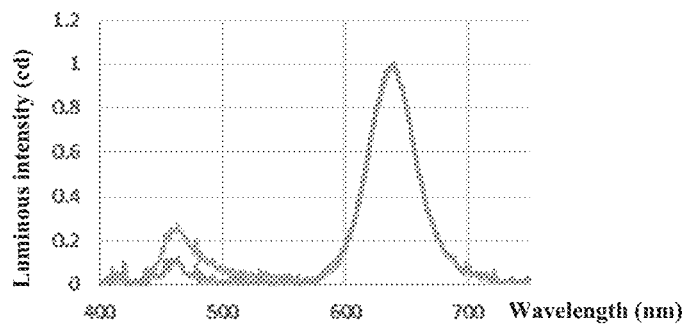
FIG. 18B shows light spectrum detected in a display panel depicted in FIG. 17.

FIG. 17 is a schematic diagram illustrating the structure of a display panel in some embodiments according to the present disclosure. Referring to FIG. 17, the counter substrate CS in some embodiments includes a filler layer FIL (in lieu of the lens layer LEL or the reflective coating layer RECL) between the array substrate AS and the quantum dots material layer QDML. As shown in FIG. 17, light emitted from a respective one of the plurality of light emitting blocks EL may transmit into an adjacent subpixel, and into an adjacent quantum dots block, resulting in color cross-contamination. FIG. 18A shows light spectrum detected in a display panel depicted in FIG. 17. As shown in FIG. 18A, when only green subpixels of the display panel are configured to emit light and blue subpixels and red subpixels are turned off, the light spectrum detected in a display panel depicted in FIG. 17 contains a small peak in a range of 400 nm to 500 nm, indicating color cross-contamination from a respective green subpixel into an adjacent blue subpixel. FIG. 18B shows light spectrum detected in a display panel depicted in FIG. 17. As shown in FIG. 18B, when only red subpixels of the display panel are configured to emit light and blue subpixels and green subpixels are turned off, the light spectrum detected in a display panel depicted in FIG. 17 also contains a small peak in a range of 400 nm to 500 nm, indicating color cross-contamination from a respective red subpixel into an adjacent blue subpixel. The luminous intensity in FIG. 18A or FIG. 18B is normalized luminous intensity.

Figure 19A:
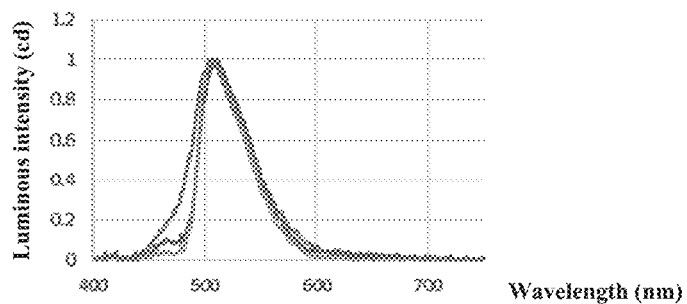
FIG. 19A shows light spectrum detected in a display panel depicted in FIG. 15.
Figure 19B:
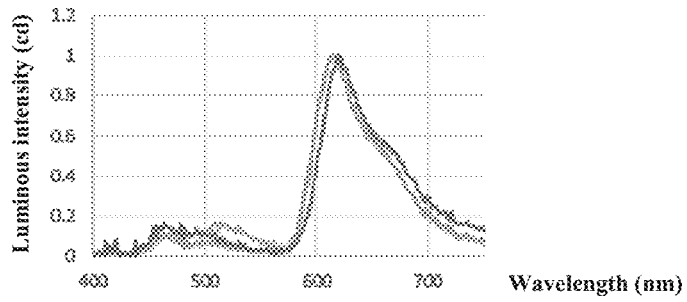
FIG. 19B shows light spectrum detected in a display panel depicted in FIG. 15.

As shown in FIG. 15, light emitted from a respective one of the plurality of light emitting blocks EL encounters a lens portion LP of the lens layer LEL, the incident light is converged at an interface between the lens portion LP and a medium (e.g., air) outside of the lens portion LP. The refracted light continues travelling through the lens portion LP until it arrives at the bank layer BL, where the light is either absorbed (e.g., when the bank layer BL is made of a black material or light absorbing material) or reflected back (e.g., when the bank layer BL is made of a reflective material) to the array substrate AS. As shown in FIG. 16, light emitted from a respective one of the plurality of light emitting blocks EL encounters a reflective portion RP of the reflective coating layer RECL, the incident light is reflected on a surface of the reflective portion RP. The reflected light continues traveling toward a respective one of the plurality of quantum dots blocks (e.g., QDB2) in a same subpixel region (keeping the reflective light in a same subpixel region as the incident light). The inventors of the present disclosure discover that, by having a lens layer or a reflective coating layer RECL throughout the inter-subpixel region ISR, cross-contamination of light between adjacent subpixel regions can be surprisingly yet effectively prevented. FIG. 19A shows light spectrum detected in a display panel depicted in FIG. 15. FIG. 19B shows light spectrum detected in a display panel depicted in FIG. 15. Luminous intensity in FIG. 19A is measure when only green subpixels of the display panel are configured to emit light and blue subpixels and red subpixels are turned off. Luminous intensity in FIG. 19B is measured when only red subpixels of the display panel are configured to emit light and blue subpixels and green subpixels are turned off. The luminous intensity in FIG. 19A or FIG. 19B is normalized luminous intensity. Comparing these results with those in FIG. 18A and FIG. 18B, the color cross-contamination is substantially eliminated or significantly reduced by having a lens layer in lieu of a filler layer.

Referring to FIG. 15, in some embodiment, a cell gap CG between the overcoat layer OC of the counter substrate CS and the second inorganic encapsulating sub-layer CVD2 of the encapsulating layer EN of the array substrate AS is in a range of 1 μm to 6 μm, 1 μm to 2 μm, 2 μm to 3 μm, 3 μm to 4 μm, 4 μm to 5 μm, or 5 μm to 6 μm. Optionally, the cell gap CG in in a range of 2 μm to 3 μm. Optionally, a thickness of the lens layer LEL is in a range of 1 μm to 6 μm, 1 μm to 2 μm, 2 μm to 3 μm 3 μm to 4 μm, 4 μm to 5 μm, or 5 μm to 6 μm. Optionally, a thickness of the lens layer LEL is in a range of 2 μm to 3 μm.

Referring to FIG. 16, in some embodiment, a cell gap CG between the overcoat layer OC of the counter substrate CS and the second inorganic encapsulating sub-layer CVD2 of the encapsulating layer EN of the array substrate AS is in a range of 1 μm to 6 μm, 1 μm to 2 μm, 2 μm to 3 μm, 3 μm to 4 μm, 4 μm to 5 μm, or 5 μm to 6 μm. Optionally, the cell gap CG in in a range of 2 μm to 3 μm. Optionally, a thickness of a combination of the lens layer LEL and the reflective coating layer RECL is in a range of 1 μm to 6 μm, 1 μm to 2 μm, 2 μm to 3 μm, 3 μm to 4 μm, 4 μm to 5 μm, or 5 μm to 6 μm. Optionally, a thickness of the combination of the lens layer LEL and the reflective coating layer RECL is in a range of 2 μm to 3 μm.

Figure 20:
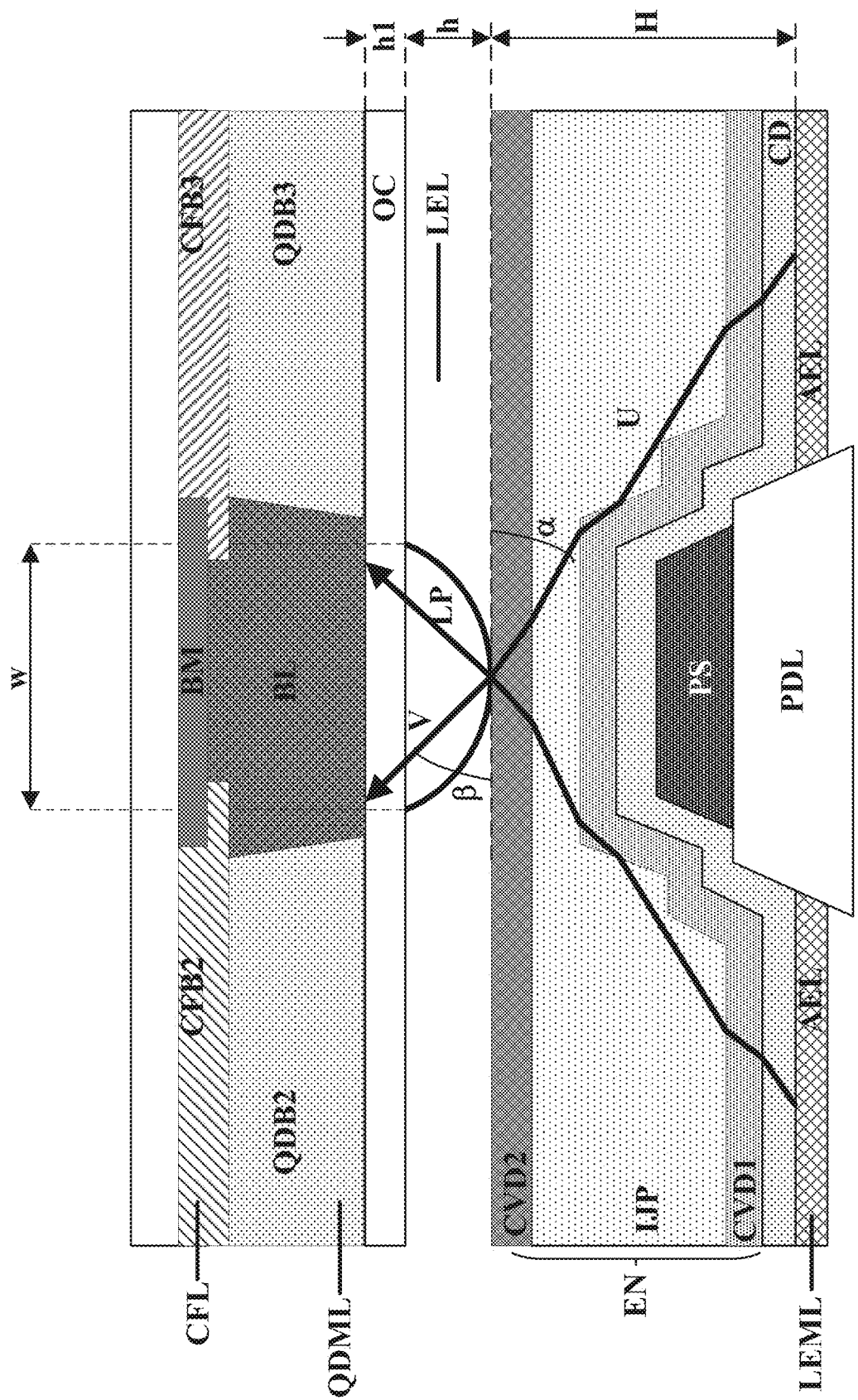
FIG. 20 illustrates a working principle of a lens portion in a counter substrate in some embodiments according to the present disclosure.

FIG. 20 illustrates a working principle of a lens portion in a counter substrate in some embodiments according to the present disclosure. Referring to FIG. 20, in some embodiments, a focal length of a lens portion LP of the lens layer LEL is expressed as:

$$1/f = 1/U + 1/V;$$

wherein f stands for the focal length of the lens portion LP; U stands for a first light path distance along a first light path of an edge light at a maximum view angle of an adjacent light emitting block AEL with respect to the lens portion LP travelling from the adjacent light emitting block AEL to the lens portion LP; V stands for a second light path distance along a second light path of the edge light from the lens portion LP to the bank layer BL. Optionally, $U = H/\sin(\alpha)$; $V = (h1+h)/\sin(\beta)$; α is a first angle between the first light path and a plane containing a surface of the array substrate in direct contact with the lens portion; β is a second angle between the plane containing the surface of the array substrate in direct contact with the lens portion and the second light path; H is a shortest distance between a surface of the adjacent light emitting block and the plane containing the surface of the array substrate in direct contact with the lens portion; and (h1+h) is a shortest distance between the plane containing the surface of the array substrate in direct contact with the lens portion and the bank layer.

In some embodiments, a width w of the lens portion LP along a direction from a first adjacent bank aperture to a second adjacent bank aperture is expressed as:

$$L = (2(h1+h)/\tan(\beta)) + Z;$$

wherein Z stands for an assembling tolerance in assembling the counter substrate and the array substrate.

Optionally, the width w of the lens portion LP along the direction from a first adjacent bank aperture to a second adjacent bank aperture is in a range of 1 μm to 6 μm, 1 μm to 2 μm, 2 μm to 3 μm, 3 μm to 4 μm, 4 μm to 5 μm, or 5 μm to 6 μm.

In some embodiments, a curvature radius of the lens portion is expressed as:

$$r=2f*(n-1);$$

wherein r stands for the curvature radius; and n stands for a refractive index of the lens portion LP.

In another aspect, the present disclosure provides a display apparatus. In some embodiments, the display apparatus includes the display panel described herein or fabricated by a method described herein, and an integrated circuit connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

Figure 21:
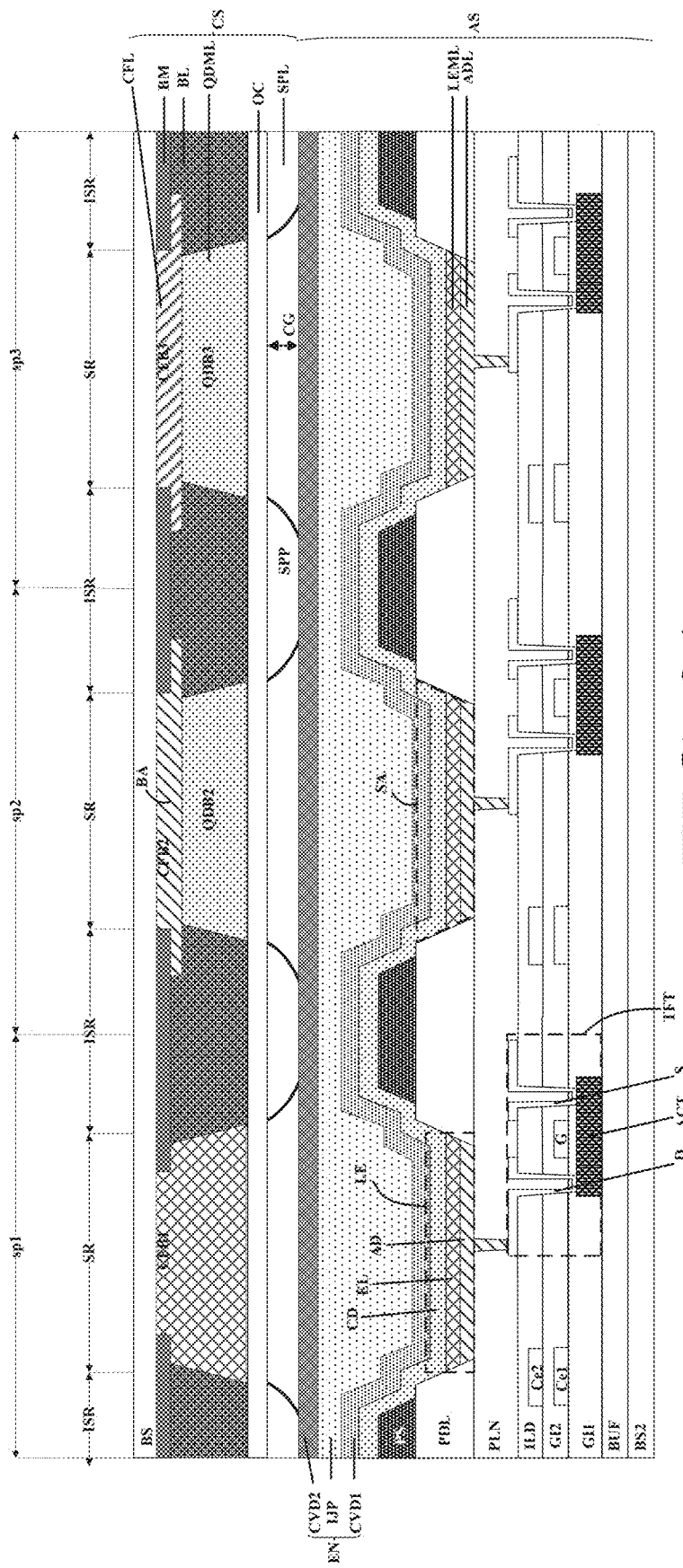
FIG. 21 is a schematic diagram illustrating the structure of a display panel in some embodiments according to the present disclosure.
Figure 22:
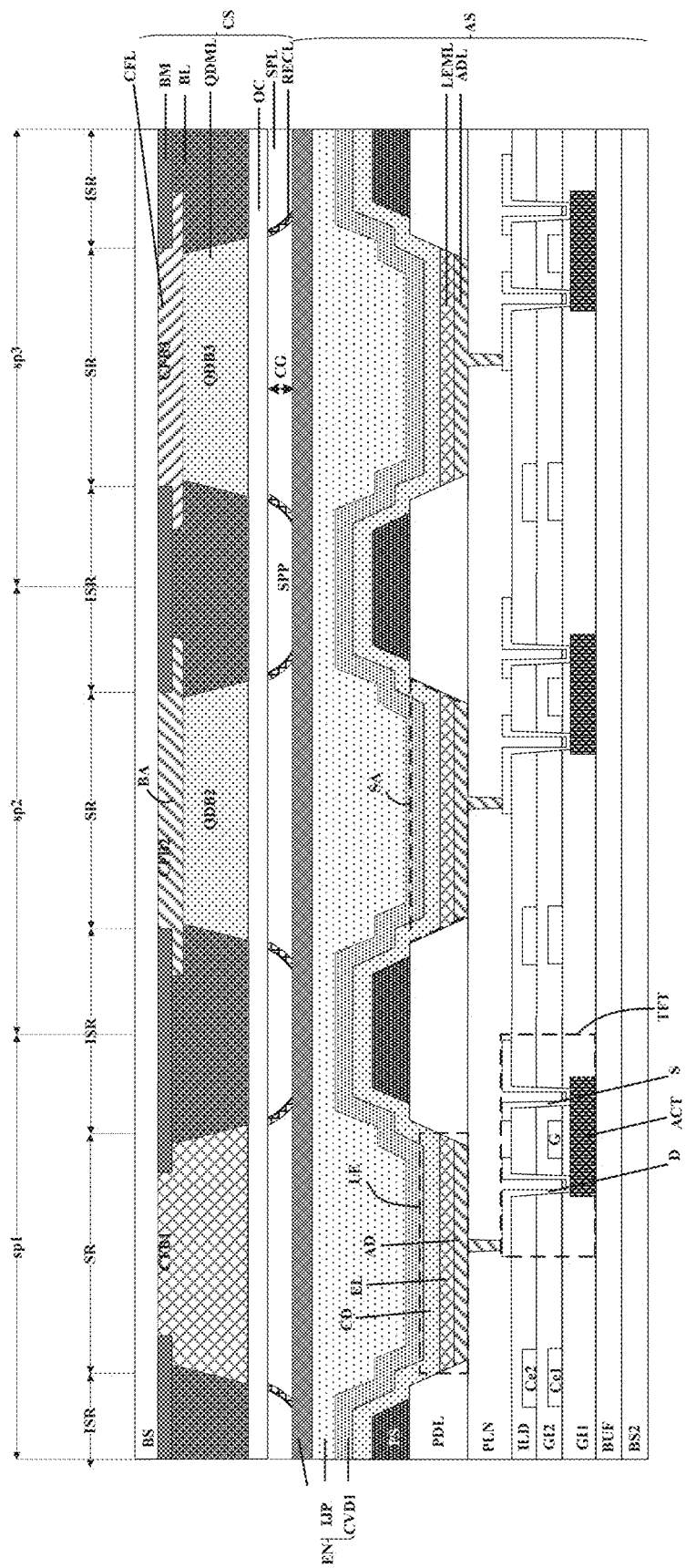
FIG. 22 is a schematic diagram illustrating the structure of a display panel in some embodiments according to the present disclosure.

FIG. 21 is a schematic diagram illustrating the structure of a display panel in some embodiments according to the present disclosure. Referring to FIG. 21, in lieu of a lens layer LEL, the display panel includes a support layer SPL on a side of the quantum dots material layer QDML and the bank layer BL away from the base substrate BS. The support layer SPL in some embodiments includes one or more support portions SPP, orthographic projections of which on the base substrate being adjacent to a periphery of an orthographic projection of a respective one of the plurality of bank apertures BA on the base substrate. In some embodiments, the bank layer BL and the lens layer LEL are in an inter-subpixel region ISR of the counter substrate. Optionally, at least one of the bank layer and the lens layer LEL is limited in the inter-subpixel region ISR of the counter substrate. In some embodiments, the support layer SPL is a lens layer LEL as depicted in FIG FIG. 22 is a schematic diagram illustrating the structure of a display panel in some embodiments according to the present disclosure. Referring to FIG. 22, in lieu of a lens layer LEL, the display panel includes a support layer SPL on a side of the quantum dots material layer QDML and the bank layer BL away from the base substrate BS. The display panel further includes a reflective coating layer RECL. The reflective coating layer RECL in some embodiments includes one or more reflective portions RP, orthographic projections of which on the base substrate being adjacent to a periphery of an orthographic projection of a respective one of the plurality of bank apertures BA on the base substrate. In some embodiments, the bank layer BL, the support layer SPL, and the reflective coating layer RECL are in an inter-subpixel region ISR of the counter substrate. Optionally, at least one of the bank layer BL, the support layer SPL, or the reflective coating layer RECL, is limited in the inter-subpixel region ISR of the counter substrate.

The support layer SPL and the support portion SPP may be made of an organic or inorganic material such as an organic polymer material, silicon oxide, and silicon nitride. A cross-section of the support portion SPP along a direction from a first adjacent bank aperture to a second adjacent bank aperture may have various appropriate shapes such as a trapezoidal shape, a rectangular shape, or a shape comprising a combination of a rectangle with partial circles on two side of the rectangle. In one example, the support layer SPL and the support portion SPP are made of a transparent material. In another example, the support layer SPL and the support portion SPP are made of an opaque material.

In another aspect, the present disclosure further provides a method of fabricating a counter substrate. In some embodiments, the method includes forming a bank layer on the base substrate, the bank layer defining a plurality of bank apertures; forming a quantum dots material layer on the base substrate, the quantum dots material layer comprising a plurality of quantum dots blocks respectively in at least some of the plurality of bank apertures; and forming a lens layer on a side of the quantum dots material layer and the bank layer away from the base substrate. Optionally, forming the lens layer includes forming one or more lens portions, orthographic projections of which on the base substrate adjacent to a periphery of an orthographic projection of a respective one of the plurality of bank apertures on the base substrate. Optionally, the bank layer and the lens layer are formed in an inter-subpixel region of the counter substrate. Optionally, an orthographic projection of the bank layer on the base substrate at least partially overlaps with an orthographic projection of the lens layer on the base substrate. Optionally, the orthographic projection of the bank layer on the base substrate covers the orthographic projection of the lens layer on the base substrate.

In some embodiments, the lens layer is formed as a unitary net structure with a plurality of openings. Optionally, lens portions of the lens layer are formed to surround a respective one of the plurality of openings In some embodiments, the method further includes forming a reflective coating layer on a side of the lens layer away from the base substrate. Optionally, the reflective coating layer is formed in the inter-subpixel region of the counter substrate. Optionally, the orthographic projection of the bank layer on the base substrate covers an orthographic projection of the reflective coating layer on the base substrate. Optionally, forming the reflective coating layer includes forming one or more reflective portions respectively coated on surfaces of the one or more lens portions.

In some embodiments, the reflective coating layer is formed as a unitary net structure with a plurality of openings. Optionally, reflective portions of the reflective coating layer are formed to surround a respective one of the plurality of openings.

In some embodiments, the method further includes forming an overcoat layer on a side of the quantum dots material layer and the bank layer away from the base substrate. Optionally, the lens layer is formed on a side of the overcoat layer away from the base substrate.

In some embodiments, the method further includes forming a black matrix in the inter-subpixel region of the counter substrate. Optionally, the orthographic projection of the bank layer on the base substrate covers an orthographic projection of the black matrix on the base substrate.

In some embodiments, the method further includes forming a color filter layer on the base substrate. Optionally, forming the color filter layer includes forming a plurality of color filter blocks respectively in the plurality of bank apertures.

In another aspect, the present disclosure further provides a method of fabricating a display panel. In some embodiments, forming the display panel includes forming an array substrate, forming a counter substrate, and assembling the array substrate and the counter substrate together.

In some embodiments, forming the counter substrate includes forming a bank layer on a base substrate, the bank layer defining a plurality of bank apertures; forming a quantum dots material layer on the base substrate, the quantum dots material layer comprising a plurality of quantum dots blocks respectively in at least some of the plurality of bank apertures; and forming a lens layer on a side of the quantum dots material layer and the bank layer away from the base substrate. Optionally, forming the lens layer includes forming one or more lens portions, orthographic projections of which on the base substrate adjacent to a periphery of an orthographic projection of a respective one of the plurality of bank apertures on the base substrate. Optionally, the bank layer and the lens layer are formed in an inter-subpixel region of the counter substrate. Optionally, an orthographic projection of the bank layer on the base substrate at least partially overlaps with an orthographic projection of the lens layer on the base substrate. Optionally, the orthographic projection of the bank layer on the base substrate covers the orthographic projection of the lens layer on the base substrate.

In some embodiments, the one or more lens portions of the lens layer are formed to be in direct contact with the array substrate.

In some embodiments, the lens layer is formed as a unitary net structure with a plurality of openings. Optionally, lens portions of the lens layer are formed to surround a respective one of the plurality of openings.

In some embodiments, forming the array substrate includes forming a plurality of thin film transistors on a second base substrate; forming a planarization layer on a side of the plurality of thin film transistors away from the second base substrate; forming an anode layer comprising a plurality of anodes on a side of the planarization layer away from the second base substrate; forming a pixel definition layer on a side of the planarization layer and the anode layer away from the second base substrate, the pixel definition layer defining a plurality of subpixel apertures; forming a light emitting material layer on a side of the anode layer away from the second base substrate, the light emitting material layer comprising a plurality of light emitting blocks respectively in the plurality of subpixel apertures; forming a cathode layer on a side of the light emitting material layer away from the second base substrate; and forming an encapsulating layer on a side of the cathode layer away from the second base substrate. Optionally, the one or more lens portions of the lens layer are formed to be in direct contact with the encapsulating layer. Optionally, the pixel definition layer is formed in the inter-subpixel region of the display panel. Optionally, an orthographic projection of the bank layer on the base substrate at least partially overlaps with an orthographic projection of the pixel definition layer on the base substrate. Optionally, the orthographic projection of the bank layer on the base substrate covers the orthographic projection of the lens layer on the base substrate; and the orthographic projection of the pixel definition layer on the base substrate covers the orthographic projection of the lens layer on the base substrate.

In some embodiments, forming the counter substrate further includes forming a reflective coating layer on a side of the lens layer away from the base substrate. Optionally, the reflective coating layer is formed in the inter-subpixel region of the counter substrate. Optionally, orthographic projections of the bank layer and the pixel definition layer on the base substrate covers an orthographic projection of the reflective coating layer on the base substrate. Optionally, forming the reflective coating layer includes forming one or more reflective portions respectively coated on surfaces of the one or more lens portions.

In some embodiments, the reflective coating layer is formed as a unitary net structure with a plurality of openings. Optionally, reflective portions of the reflective coating layer are formed to surround a respective one of the plurality of openings.

In some embodiments, forming the counter substrate further includes forming an overcoat layer on a side of the quantum dots material layer and the bank layer away from the base substrate. Optionally, the lens layer is formed on a side of the overcoat layer away from the base substrate.

In some embodiments, the counter substrate and the array substrate are assembled to have a cell gap between the overcoat layer of the counter substrate and the array substrate in a range of 1 μm to 6 μm.

In some embodiments, forming the counter substrate further includes forming a black matrix in the inter-subpixel region of the counter substrate. Optionally, the orthographic projection of the bank layer on the base substrate covers an orthographic projection of the black matrix on the base substrate.

In some embodiments, forming the counter substrate further includes forming a color filter layer on the base substrate. Optionally, forming the color filter layer includes forming a plurality of color filter blocks respectively in the plurality of bank apertures.

Various appropriate insulating materials and various appropriate fabricating methods may be used to make the quantum dots material layer QDML. Examples of quantum dots materials include CdS, CdSe, CdTe, ZnSe, InP, PbS, CsPbCl3, CsPbBr3, CsPhI3, CsPbClxBr3-x, CsPbBrxI3-x, CdS/ZnS, CdSe/ZnS, ZnSe, InP/ZnS, PbS/ZnS, CsPbClI/ZnS, CsPbBr3/ZnS, CsPhI3/ZnS, CsPbClxBr3-x/ZnS, CsPbBrxI3-x/ZnS, and a combination thereof, where x<3.

Various appropriate insulating materials and various appropriate fabricating methods may be used to make the bank layer BL. For example, an insulating material may be deposited on the substrate by a plasma-enhanced chemical vapor deposition (PECVD) process. Examples of appropriate insulating materials for making the bank layer BL include organic insulating materials and inorganic insulating materials. Examples of organic insulating materials include photoresist materials, photosensitive polyimide, resin materials (e.g., a photosensitive diazonaphtho-quinone-phenolic resin), and acrylate materials. Examples of inorganic insulating materials include silicon nitride (SiNx), silicon oxide (SiOx), and silicon oxide nitride (SiO$_x$N$_y$). The bank layer BL may have any appropriate color. Examples of colors of the bank layer BL include black, yellow, gray, and white.

Various appropriate reflective materials and various appropriate fabricating methods may be used for making the reflective coating layer RECL. Examples of appropriate reflective materials for making the reflective coating layer RECL include metals having high reflectivity such as silver and aluminum.

Various appropriate materials and fabricating methods may be used for forming the lens layer LEL. For example, the lens layer LEL may be made of a transparent organic or inorganic material such as glass, quartz, or resin. The lens layer LEL may be formed by, e.g., exposing and developing a photoresist material, laser writing, plasma writing, three-dimensional printing, etc. Examples of lenses include, but are not limited to, cylindrical lenses, semi-cylindrical lenses, biconvex lenses, biconcave lenses, planoconcave lenses, planoconvex lenses, meniscus lenses, concave-convex lenses, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A counter substrate, comprising:
a base substrate;
a bank layer on the base substrate, the bank layer defining a plurality of bank apertures;
a quantum dots material layer on the base substrate, the quantum dots material layer comprising a plurality of quantum dots blocks respectively in at least some of the plurality of bank apertures; and
a support layer on a side of the quantum dots material layer and the bank layer away from the base substrate;
wherein the support layer comprises one or more support portions;
orthographic projections of the one or more support portions on the base substrate are adjacent to a periphery of an orthographic projection of a respective one of the plurality of bank apertures on the base substrate;
the bank layer and the support layer are in an inter-subpixel region of the counter substrate; and
an orthographic projection of the bank layer on the base substrate at least partially overlaps with an orthographic projection of the support layer on the base substrate;
wherein the support layer is a lens layer comprising one or more lens portions; orthographic projections of the one or more lens portions on the base substrate are adjacent to a periphery of an orthographic projection of a respective one of the plurality of bank apertures on the base substrate;
the bank layer and the lens layer are in the inter-subpixel region of the counter substrate; and
an orthographic projection of the bank layer on the base substrate at least partially overlaps with an orthographic projection of the lens layer on the base substrate.

2. The counter substrate of claim 1, wherein the orthographic projection of the bank layer on the base substrate covers the orthographic projection of the lens layer on the base substrate.

3. The counter substrate of claim 1, wherein the lens layer is a unitary net structure with a plurality of openings; and
a respective one of the plurality of openings is surrounded by lens portions of the lens layer.

4. The counter substrate of claim 1, further comprising a low refractive index material in a space between adjacent lens portions of the lens layer; wherein a refractive index of the low refractive index material is less than a refractive index of the one or more lens portions.

5. The counter substrate of claim 1, wherein a width of the respective one of the one or more lens portions on a side closer to the bank layer along a direction from a first adjacent bank aperture to a second adjacent bank aperture is substantially same as a width of the bank layer on a side closer to the respective one of the one or more lens portions along the direction from the first adjacent bank aperture to the second adjacent bank aperture.

6. The counter substrate of claim 1, wherein the lens layer is disposed substantially throughout the inter-subpixel region.

7. The counter substrate of claim 1, wherein the lens layer is limited in a portion of the inter-subpixel region between adjacent subpixels of different colors, and is absent in a portion of the inter-subpixel region between adjacent subpixels of same color.

8. The counter substrate of claim 1, further comprising a reflective coating layer on a side of the lens layer away from the base substrate;
wherein the reflective coating layer is in the inter-subpixel region of the counter substrate;
the orthographic projection of the bank layer on the base substrate covers an orthographic projection of the reflective coating layer on the base substrate; and
the reflective coating layer comprises one or more reflective portions respectively coated on surfaces of the one or more lens portions.

9. The counter substrate of claim 8, wherein the reflective coating layer is a unitary net structure with a plurality of openings; and
a respective one of the plurality of openings is surrounded by reflective portions of the reflective coating layer.

10. The counter substrate of claim 1, further comprising an overcoat layer on a side of the quantum dots material layer and the bank layer away from the base substrate;
wherein the lens layer is on a side of the overcoat layer away from the base substrate.

11. The counter substrate of claim 1, further comprising a black matrix in the inter-subpixel region of the counter substrate; and
the orthographic projection of the bank layer on the base substrate covers an orthographic projection of the black matrix on the base substrate.

12. The counter substrate of claim 1, further comprising a color filter layer on the base substrate;
wherein the color filter layer comprises a plurality of color filter blocks respectively in the plurality of bank apertures.

13. A display panel, comprising:
an array substrate; and
a counter substrate facing the array substrate;
wherein the counter substrate comprises:
a base substrate;
a bank layer on the base substrate, the bank layer defining a plurality of bank apertures;
a quantum dots material layer on the base substrate, the quantum dots material layer comprising a plurality of quantum dots blocks respectively in at least some of the plurality of bank apertures; and a support layer on a side of the quantum dots material layer and the bank layer away from the base substrate;

wherein the support layer comprises one or more support portions;

orthographic projections of the one or more support portions on the base substrate are adjacent to a periphery of an orthographic projection of a respective one of the plurality of bank apertures on the base substrate;

the bank layer and the support layer are in an inter-subpixel region of the display panel; and an orthographic projection of the bank layer on the base substrate at least partially overlaps with an orthographic projection of the support layer on the base substrate;

wherein the support layer is a lens layer comprising one or more lens portions;

orthographic projections of the one or more lens portions on the base substrate are adjacent to a periphery of an orthographic projection of a respective one of the plurality of bank apertures on the base substrate;

the bank layer and the lens layer are in the inter-subpixel region of the counter substrate; and an orthographic projection of the bank layer on the base substrate at least partially overlaps with an orthographic projection of the lens layer on the base substrate.

14. The display panel of claim 13, wherein the one or more lens portions of the lens layer are in direct contact with a second inorganic encapsulating sub-layer of an encapsulating layer in the array substrate.

15. The display panel of claim 13, wherein a focal length of a lens portion of the lens layer is expressed as:

$$1/f = 1/U + 1/V;$$

wherein f stands for the focal length of the lens portion; U stands for a first light path distance along a first light path of an edge light at a maximum view angle of an adjacent light emitting block with respect to the lens portion travelling from the adjacent light emitting block to the lens portion; V stands for a second light path distance along a second light path of the edge light from the lens portion to the bank layer;

$$U = H/\sin(\alpha);$$

$$V = (h1+h)/\sin(\beta);$$

$\alpha$ is a first angle between the first light path and a plane containing a surface of the array substrate in direct contact with the lens portion;

$\beta$ is a second angle between the plane containing the surface of the array substrate in direct contact with the lens portion and the second light path;

H is a shortest distance between a surface of the adjacent light emitting block and the plane containing the surface of the array substrate in direct contact with the lens portion; and (h1+h) is a shortest distance between the plane containing the surface of the array substrate in direct contact with the lens portion and the bank layer.

16. The display panel of claim 15, wherein a width of the lens portion along a direction from a first adjacent bank aperture to a second adjacent bank aperture is expressed as:

$$L = (2(h1+h)/\tan(\beta)) + Z;$$

wherein Z stands for an assembling tolerance in assembling the counter substrate and the array substrate.

17. The display panel of claim 15, wherein a curvature radius of the lens portion is expressed as:

$$r = 2f^*(n-1);$$

wherein r stands for the curvature radius; and n stands for a refractive index of the lens portion.

18. A display apparatus, comprising the display panel of claim 13, and an integrated circuit connected to the display panel.

* * * * *